United States Patent
Yu et al.

(10) Patent No.: US 8,835,831 B2
(45) Date of Patent: Sep. 16, 2014

(54) POLARIZED LIGHT DETECTING DEVICE AND FABRICATION METHODS OF THE SAME

(75) Inventors: Young-June Yu, Cranbury, NJ (US); Munib Wober, Topsfield, MA (US)

(73) Assignee: Zena Technologies, Inc., Cambridge, MA (US)

(*) Notice: Subject to any disclaimer, the term of this patent is extended or adjusted under 35 U.S.C. 154(b) by 279 days.

(21) Appl. No.: 13/047,392

(22) Filed: Mar. 14, 2011

(65) Prior Publication Data

US 2011/0309240 A1   Dec. 22, 2011

(51) Int. Cl.
- G02F 1/01 (2006.01)
- H01L 27/144 (2006.01)
- H01L 31/105 (2006.01)
- H01L 31/0352 (2006.01)

(52) U.S. Cl.
CPC ............ H01L 27/1443 (2013.01); Y02E 10/50 (2013.01); H01L 31/105 (2013.01); H01L 31/035281 (2013.01)
USPC .......................................................... 250/225

(58) Field of Classification Search
CPC ................... H01L 27/14652; H01L 27/14621; H01L 27/14625; H01L 31/035281; H01L 31/105; Y02E 10/50
USPC ................................... 250/225; 356/364, 367
See application file for complete search history.

(56) References Cited

U.S. PATENT DOCUMENTS

| | | | |
|---|---|---|---|
| 1,918,848 A | 7/1933 | Land et al. | |
| 3,903,427 A | 9/1975 | Pack | |
| 4,017,332 A | 4/1977 | James | |
| 4,357,415 A | 11/1982 | Hartman | |
| 4,387,265 A | 6/1983 | Dalal | |
| 4,400,221 A | 8/1983 | Rahilly | |
| 4,443,890 A | 4/1984 | Eumurian | |
| 4,513,168 A | 4/1985 | Borden | |
| 4,620,237 A | 10/1986 | Traino | |

(Continued)

FOREIGN PATENT DOCUMENTS

| EP | 0809303 B1 | 9/2006 |
|---|---|---|
| GB | 2348399 A | 4/2000 |

(Continued)

OTHER PUBLICATIONS

U.S. Office Action for U.S. Appl. No. 13/494,661, notification date Nov. 7, 2012.

(Continued)

*Primary Examiner* — Thanh Luu

(74) *Attorney, Agent, or Firm* — Pillsbury Winthrop Shaw Pittman LLP

(57) ABSTRACT

Described herein is a device operable to detect polarized light comprising: a substrate; a first subpixel; a second subpixel adjacent to the first subpixel; a first plurality of features in the first subpixel and a second plurality of features in the second subpixel, wherein the first plurality of features extend essentially perpendicularly from the substrate and extend essentially in parallel in a first direction parallel to the substrate and the second plurality of features extend essentially perpendicularly from the substrate and extend essentially in parallel in a second direction parallel to the substrate; wherein the first direction and the second direction are different; the first plurality of features and the second plurality of features react differently to the polarized light.

36 Claims, 34 Drawing Sheets

(56) References Cited

U.S. PATENT DOCUMENTS

| | | |
|---|---|---|
| 4,827,335 A | 5/1989 | Saito |
| 4,846,556 A | 7/1989 | Haneda |
| 4,880,613 A | 11/1989 | Satoh |
| 4,896,941 A | 1/1990 | Hayashi |
| 4,950,625 A | 8/1990 | Nakashima |
| 4,971,928 A | 11/1990 | Fuller |
| 4,972,244 A | 11/1990 | Buffet |
| 5,096,520 A | 3/1992 | Faris |
| 5,124,543 A | 6/1992 | Kawashima |
| 5,247,349 A | 9/1993 | Olego |
| 5,272,518 A | 12/1993 | Vincent |
| 5,311,047 A | 5/1994 | Chang |
| 5,347,147 A | 9/1994 | Jones |
| 5,362,972 A | 11/1994 | Yazawa |
| 5,374,841 A | 12/1994 | Goodwin |
| 5,401,968 A | 3/1995 | Cox |
| 5,449,626 A | 9/1995 | Hezel |
| 5,468,652 A | 11/1995 | Gee |
| 5,602,661 A | 2/1997 | Schadt et al. |
| 5,612,780 A | 3/1997 | Rickenbach |
| 5,671,914 A | 9/1997 | Kalkhoran |
| 5,696,863 A | 12/1997 | Kleinerman |
| 5,723,945 A | 3/1998 | Schermerhorn |
| 5,747,796 A | 5/1998 | Heard |
| 5,767,507 A | 6/1998 | Unlu et al. |
| 5,798,535 A | 8/1998 | Huang |
| 5,844,290 A | 12/1998 | Furumiya |
| 5,853,446 A | 12/1998 | Carre |
| 5,857,053 A | 1/1999 | Kane |
| 5,877,492 A | 3/1999 | Fujieda |
| 5,880,495 A | 3/1999 | Chen |
| 5,900,623 A | 5/1999 | Tsang et al. |
| 5,943,463 A | 8/1999 | Unuma |
| 6,033,582 A | 3/2000 | Lee |
| 6,037,243 A | 3/2000 | Ha et al. |
| 6,046,466 A | 4/2000 | Ishida et al. |
| 6,074,892 A | 6/2000 | Bowers et al. |
| 6,100,551 A | 8/2000 | Lee |
| 6,270,548 B1 | 8/2001 | Campbell |
| 6,301,420 B1 | 10/2001 | Greenaway |
| 6,326,649 B1 | 12/2001 | Chang |
| 6,388,243 B1 | 5/2002 | Berezin |
| 6,388,648 B1 | 5/2002 | Clifton |
| 6,407,439 B1 | 6/2002 | Hier |
| 6,459,034 B2 | 10/2002 | Muramoto et al. |
| 6,463,204 B1 | 10/2002 | Ati |
| 6,542,231 B1 | 4/2003 | Garrett |
| 6,563,995 B2 | 5/2003 | Keaton |
| 6,566,723 B1 | 5/2003 | Vook |
| 6,680,216 B2 | 1/2004 | Kwasnick et al. |
| 6,709,929 B2 | 3/2004 | Zhang |
| 6,720,594 B2 | 4/2004 | Rahn |
| 6,771,314 B1 | 8/2004 | Bawolek |
| 6,805,139 B1 | 10/2004 | Savas |
| 6,812,473 B1 | 11/2004 | Amemiya |
| 6,927,145 B1 | 8/2005 | Yang |
| 6,960,526 B1 | 11/2005 | Shah |
| 6,967,120 B2 | 11/2005 | Jang |
| 6,969,899 B2 | 11/2005 | Yaung |
| 6,987,258 B2 | 1/2006 | Mates |
| 6,996,147 B2 | 2/2006 | Majumdar |
| 7,052,927 B1 | 5/2006 | Fletcher et al. |
| 7,064,372 B2 | 6/2006 | Duan |
| 7,105,428 B2 | 9/2006 | Pan |
| 7,109,517 B2 | 9/2006 | Zaidi |
| 7,135,698 B2 * | 11/2006 | Mitra ................................ 257/21 |
| 7,153,720 B2 | 12/2006 | Augusto |
| 7,163,659 B2 | 1/2007 | Stasiak |
| 7,208,783 B2 | 4/2007 | Palsule |
| 7,230,286 B2 | 6/2007 | Cohen |
| 7,235,475 B2 | 6/2007 | Kamins |
| 7,241,434 B2 | 7/2007 | Anthony |
| 7,254,151 B2 | 8/2007 | Lieber |
| 7,262,400 B2 | 8/2007 | Yaung |
| 7,265,328 B2 | 9/2007 | Mouli |
| 7,272,287 B2 | 9/2007 | Bise |
| 7,285,812 B2 | 10/2007 | Tang et al. |
| 7,306,963 B2 | 12/2007 | Linden |
| 7,307,327 B2 | 12/2007 | Bahl |
| 7,311,889 B2 | 12/2007 | Awano |
| 7,330,404 B2 | 2/2008 | Peng |
| 7,335,962 B2 | 2/2008 | Mouli |
| 7,336,860 B2 | 2/2008 | Cyr |
| 7,358,583 B2 | 4/2008 | Reznik |
| 7,381,966 B2 | 6/2008 | Starikov |
| 7,446,025 B2 | 11/2008 | Cohen |
| 7,462,774 B2 | 12/2008 | Roscheisen |
| 7,471,428 B2 | 12/2008 | Ohara |
| 7,491,269 B2 | 2/2009 | Legagneux |
| 7,507,293 B2 | 3/2009 | Li |
| 7,521,322 B2 | 4/2009 | Tang et al. |
| 7,524,694 B2 | 4/2009 | Adkisson |
| 7,582,587 B2 | 9/2009 | Gruev |
| 7,582,857 B2 * | 9/2009 | Gruev et al. .................. 250/225 |
| 7,598,482 B1 | 10/2009 | Verhulst |
| 7,622,367 B1 | 11/2009 | Nuzzo |
| 7,626,685 B2 | 12/2009 | Jin |
| 7,646,138 B2 | 1/2010 | Williams |
| 7,646,943 B1 | 1/2010 | Wober |
| 7,647,695 B2 | 1/2010 | MacNutt |
| 7,655,860 B2 | 2/2010 | Parsons |
| 7,663,202 B2 | 2/2010 | Wang et al. |
| 7,692,860 B2 * | 4/2010 | Sato et al. ................. 359/485.05 |
| 7,704,806 B2 | 4/2010 | Chae |
| 7,713,779 B2 | 5/2010 | Firon |
| 7,719,678 B2 | 5/2010 | Kamins |
| 7,719,688 B2 | 5/2010 | Kamins |
| 7,732,769 B2 | 6/2010 | Snider |
| 7,732,839 B2 | 6/2010 | Sebe |
| 7,736,954 B2 | 6/2010 | Hussain |
| 7,740,824 B2 | 6/2010 | Godfried |
| 7,888,155 B2 | 2/2011 | Chen |
| 8,030,729 B2 | 10/2011 | Quitoriano |
| 8,035,184 B1 | 10/2011 | Dutta et al. |
| 8,049,203 B2 | 11/2011 | Samuelson |
| 8,063,450 B2 | 11/2011 | Wernersson et al. |
| 8,067,299 B2 | 11/2011 | Samuelson |
| 8,084,728 B2 | 12/2011 | Tsang |
| 8,093,675 B2 | 1/2012 | Tsunemi et al. |
| 8,118,170 B2 | 2/2012 | Sato |
| 8,143,658 B2 | 3/2012 | Samuelson |
| 8,193,524 B2 | 6/2012 | Bjoerk |
| 8,212,136 B2 | 7/2012 | Landis |
| 8,212,138 B2 | 7/2012 | Landis |
| 8,222,705 B2 | 7/2012 | Ogino |
| 8,242,353 B2 | 8/2012 | Karg |
| 8,269,985 B2 | 9/2012 | Wober |
| 8,274,039 B2 | 9/2012 | Wober |
| 8,330,090 B2 | 12/2012 | Agarwal |
| 8,455,857 B2 | 6/2013 | Samuelson |
| 8,546,742 B2 | 10/2013 | Wober |
| 2002/0003201 A1 | 1/2002 | Yu |
| 2002/0020846 A1 | 2/2002 | Pi et al. |
| 2002/0021879 A1 | 2/2002 | Lee |
| 2002/0104821 A1 | 8/2002 | Bazylenko |
| 2002/0109082 A1 | 8/2002 | Nakayama |
| 2002/0130311 A1 | 9/2002 | Lieber |
| 2002/0172820 A1 | 11/2002 | Majumdar |
| 2003/0003300 A1 | 1/2003 | Korgel |
| 2003/0006363 A1 | 1/2003 | Campbell |
| 2003/0077907 A1 | 4/2003 | Kao et al. |
| 2003/0089899 A1 | 5/2003 | Lieber |
| 2003/0103744 A1 | 6/2003 | Koyama |
| 2003/0132480 A1 | 7/2003 | Chau |
| 2003/0189202 A1 | 10/2003 | Li |
| 2003/0227090 A1 | 12/2003 | Okabe |
| 2004/0026684 A1 | 2/2004 | Empedocles |
| 2004/0058058 A1 | 3/2004 | Shchegolikhin |
| 2004/0065362 A1 | 4/2004 | Watabe |
| 2004/0075464 A1 | 4/2004 | Samuelson |
| 2004/0109666 A1 | 6/2004 | Kim |
| 2004/0118337 A1 | 6/2004 | Mizutani |
| 2004/0118377 A1 | 6/2004 | Bloms |
| 2004/0122328 A1 | 6/2004 | Wang |

(56) References Cited

U.S. PATENT DOCUMENTS

| | | |
|---|---|---|
| 2004/0124366 A1 | 7/2004 | Zeng |
| 2004/0155247 A1 | 8/2004 | Benthien |
| 2004/0180461 A1 | 9/2004 | Yaung |
| 2004/0213307 A1 | 10/2004 | Lieber |
| 2004/0217086 A1 | 11/2004 | Kawashima |
| 2004/0223681 A1 | 11/2004 | Block |
| 2004/0241965 A1 | 12/2004 | Merritt |
| 2004/0261840 A1 | 12/2004 | Schmit |
| 2005/0009224 A1 | 1/2005 | Yang |
| 2005/0082676 A1 | 4/2005 | Andry |
| 2005/0087601 A1 | 4/2005 | Gerst, III |
| 2005/0095699 A1 | 5/2005 | Miyauchi et al. |
| 2005/0116271 A1 | 6/2005 | Kato |
| 2005/0133476 A1 | 6/2005 | Islam |
| 2005/0164514 A1 | 7/2005 | Rauf |
| 2005/0190453 A1 | 9/2005 | Dobashi |
| 2005/0201704 A1 | 9/2005 | Ellwood |
| 2005/0218468 A1 | 10/2005 | Owen |
| 2005/0242409 A1 | 11/2005 | Yang |
| 2005/0284517 A1 | 12/2005 | Shinohara |
| 2006/0011362 A1 | 1/2006 | Tao |
| 2006/0113622 A1 | 6/2006 | Adkisson |
| 2006/0121371 A1 | 6/2006 | Wu |
| 2006/0146323 A1 | 7/2006 | Bratkovski |
| 2006/0162766 A1 | 7/2006 | Gee |
| 2006/0260674 A1 | 11/2006 | Tran |
| 2006/0273262 A1 | 12/2006 | Sayag |
| 2006/0273389 A1 | 12/2006 | Cohen |
| 2006/0284118 A1 | 12/2006 | Asmussen |
| 2007/0012985 A1 | 1/2007 | Stumbo |
| 2007/0023799 A1 | 2/2007 | Boettiger |
| 2007/0025504 A1 | 2/2007 | Tumer |
| 2007/0029545 A1 | 2/2007 | Striakhilev |
| 2007/0052050 A1 | 3/2007 | Dierickx |
| 2007/0076481 A1 | 4/2007 | Tennant |
| 2007/0082255 A1 | 4/2007 | Sun |
| 2007/0099292 A1 | 5/2007 | Miller |
| 2007/0104441 A1 | 5/2007 | Ahn et al. |
| 2007/0108371 A1 | 5/2007 | Stevens |
| 2007/0114622 A1 | 5/2007 | Adkisson |
| 2007/0120254 A1 | 5/2007 | Hurkx et al. |
| 2007/0126037 A1 | 6/2007 | Ikeda |
| 2007/0137697 A1 | 6/2007 | Kempa |
| 2007/0138376 A1 | 6/2007 | Naughton |
| 2007/0138380 A1 | 6/2007 | Adkisson |
| 2007/0138459 A1 | 6/2007 | Wong |
| 2007/0139740 A1 | 6/2007 | Igura |
| 2007/0140638 A1 | 6/2007 | Yang |
| 2007/0145512 A1 | 6/2007 | Rhodes |
| 2007/0148599 A1 | 6/2007 | True |
| 2007/0152248 A1 | 7/2007 | Choi |
| 2007/0155025 A1 | 7/2007 | Zhang |
| 2007/0164270 A1 | 7/2007 | Majumdar |
| 2007/0170418 A1 | 7/2007 | Bowers |
| 2007/0172623 A1 | 7/2007 | Kresse |
| 2007/0187787 A1 | 8/2007 | Ackerson |
| 2007/0196239 A1 | 8/2007 | Vink |
| 2007/0200054 A1 | 8/2007 | Reznik |
| 2007/0205483 A1 | 9/2007 | Williams |
| 2007/0217754 A1 | 9/2007 | Sasaki |
| 2007/0228421 A1 | 10/2007 | Shioya et al. |
| 2007/0238265 A1 | 10/2007 | Kurashina |
| 2007/0238285 A1 | 10/2007 | Borden |
| 2007/0241260 A1 | 10/2007 | Jaeger |
| 2007/0246689 A1 | 10/2007 | Ge |
| 2007/0248958 A1 | 10/2007 | Jovanovich |
| 2007/0272828 A1 | 11/2007 | Xu |
| 2007/0285378 A1 | 12/2007 | Lankhorst |
| 2007/0290193 A1 | 12/2007 | Tucker |
| 2008/0001498 A1 | 1/2008 | Muller |
| 2008/0029701 A1 | 2/2008 | Onozawa |
| 2008/0036038 A1 | 2/2008 | Hersee |
| 2008/0044984 A1 | 2/2008 | Hsieh |
| 2008/0047601 A1 | 2/2008 | Nag |
| 2008/0047604 A1 | 2/2008 | Korevaar et al. |
| 2008/0055451 A1 | 3/2008 | Kanbe |
| 2008/0065451 A1 | 3/2008 | Kanbe |
| 2008/0073742 A1 | 3/2008 | Adkisson |
| 2008/0079022 A1 | 4/2008 | Yamamoto |
| 2008/0079076 A1 | 4/2008 | Sheen |
| 2008/0083963 A1 | 4/2008 | Hsu |
| 2008/0088014 A1 | 4/2008 | Adkisson |
| 2008/0090401 A1 | 4/2008 | Bratkovski |
| 2008/0092938 A1 | 4/2008 | Majumdar |
| 2008/0096308 A1 | 4/2008 | Santori |
| 2008/0108170 A1 | 5/2008 | Adkisson |
| 2008/0116537 A1 | 5/2008 | Adkisson |
| 2008/0128760 A1 | 6/2008 | Jun |
| 2008/0145965 A1 | 6/2008 | Reznik |
| 2008/0149944 A1 | 6/2008 | Samuelson |
| 2008/0157253 A1 | 7/2008 | Starikov |
| 2008/0166883 A1 | 7/2008 | Liu et al. |
| 2008/0169017 A1 | 7/2008 | Korevaar |
| 2008/0169019 A1 | 7/2008 | Korevaar |
| 2008/0173615 A1 | 7/2008 | Kim |
| 2008/0188029 A1 | 8/2008 | Rhodes |
| 2008/0191278 A1 | 8/2008 | Maekawa |
| 2008/0191298 A1 | 8/2008 | Lin |
| 2008/0211945 A1 | 9/2008 | Hong |
| 2008/0218740 A1 | 9/2008 | Williams |
| 2008/0224115 A1 | 9/2008 | Bakkers |
| 2008/0225140 A1 | 9/2008 | Raynor |
| 2008/0233280 A1 | 9/2008 | Blanchet |
| 2008/0237568 A1 | 10/2008 | Kobayashi |
| 2008/0246020 A1 | 10/2008 | Kawashima |
| 2008/0246123 A1 | 10/2008 | Kamins |
| 2008/0248304 A1 | 10/2008 | Hanrath |
| 2008/0251780 A1 | 10/2008 | Li |
| 2008/0258747 A1 | 10/2008 | Kluth |
| 2008/0260225 A1 | 10/2008 | Szu |
| 2008/0266556 A1 | 10/2008 | Kamins |
| 2008/0283728 A1 | 11/2008 | Inoue |
| 2008/0283883 A1 | 11/2008 | Shim |
| 2008/0297281 A1 | 12/2008 | Ayazi |
| 2008/0311693 A1 | 12/2008 | Maxwell |
| 2008/0311712 A1 | 12/2008 | Anwar et al. |
| 2009/0001498 A1 | 1/2009 | Wang |
| 2009/0020150 A1 | 1/2009 | Atwater |
| 2009/0032687 A1 | 2/2009 | Lapstun |
| 2009/0046362 A1 | 2/2009 | Guo |
| 2009/0046749 A1 | 2/2009 | Mizuuchi |
| 2009/0050204 A1 | 2/2009 | Habib |
| 2009/0057650 A1 | 3/2009 | Lieber |
| 2009/0127442 A1 | 5/2009 | Lee |
| 2009/0146198 A1 | 6/2009 | Joe |
| 2009/0151782 A1 | 6/2009 | Ko |
| 2009/0152664 A1 | 6/2009 | Klem |
| 2009/0153961 A1* | 6/2009 | Murakami et al. ............ 359/486 |
| 2009/0165844 A1 | 7/2009 | Dutta |
| 2009/0173976 A1 | 7/2009 | Augusto |
| 2009/0179289 A1 | 7/2009 | Park |
| 2009/0188552 A1 | 7/2009 | Wang |
| 2009/0189144 A1 | 7/2009 | Quitoriano |
| 2009/0189145 A1 | 7/2009 | Wang et al. |
| 2009/0199597 A1 | 8/2009 | Danley |
| 2009/0201400 A1 | 8/2009 | Zhang et al. |
| 2009/0206405 A1 | 8/2009 | Doyle |
| 2009/0224245 A1 | 9/2009 | Umezaki |
| 2009/0224349 A1 | 9/2009 | Gambino |
| 2009/0233445 A1 | 9/2009 | Lee |
| 2009/0243016 A1 | 10/2009 | Kawahara et al. |
| 2009/0244514 A1 | 10/2009 | Jin |
| 2009/0260687 A1 | 10/2009 | Park |
| 2009/0261438 A1 | 10/2009 | Choi |
| 2009/0266974 A1 | 10/2009 | Verhulst |
| 2009/0272423 A1 | 11/2009 | Niira |
| 2009/0278998 A1 | 11/2009 | El-Ghoroury et al. |
| 2009/0289320 A1 | 11/2009 | Cohen |
| 2009/0305454 A1 | 12/2009 | Cohen |
| 2010/0006817 A1 | 1/2010 | Ohlsson et al. |
| 2010/0019252 A1 | 1/2010 | Bratkovski et al. |
| 2010/0019296 A1 | 1/2010 | Cha |
| 2010/0019355 A1 | 1/2010 | Kamins |
| 2010/0090341 A1 | 4/2010 | Wan |

(56) References Cited

U.S. PATENT DOCUMENTS

| | | |
|---|---|---|
| 2010/0101633 A1 | 4/2010 | Park |
| 2010/0104494 A1 | 4/2010 | Meng |
| 2010/0110433 A1* | 5/2010 | Nedelcu et al. ............... 356/367 |
| 2010/0116976 A1 | 5/2010 | Wober |
| 2010/0132779 A1 | 6/2010 | Hong |
| 2010/0133986 A1 | 6/2010 | Kim |
| 2010/0136721 A1 | 6/2010 | Song |
| 2010/0148221 A1 | 6/2010 | Yu |
| 2010/0163714 A1 | 7/2010 | Wober |
| 2010/0163941 A1 | 7/2010 | Jung |
| 2010/0187404 A1 | 7/2010 | Klem |
| 2010/0200065 A1 | 8/2010 | Choi |
| 2010/0207103 A1 | 8/2010 | Farrow |
| 2010/0218816 A1 | 9/2010 | Guha |
| 2010/0229939 A1 | 9/2010 | Shen |
| 2010/0230653 A1 | 9/2010 | Chen |
| 2010/0237454 A1 | 9/2010 | Fujisawa |
| 2010/0244108 A1 | 9/2010 | Kohnke et al. |
| 2010/0244169 A1 | 9/2010 | Maeda et al. |
| 2010/0249877 A1 | 9/2010 | Naughton |
| 2010/0258184 A1 | 10/2010 | Laughlin |
| 2010/0276572 A1 | 11/2010 | Iwabuchi |
| 2010/0277607 A1 | 11/2010 | Choi |
| 2010/0282314 A1 | 11/2010 | Coakley |
| 2010/0295019 A1 | 11/2010 | Wang et al. |
| 2010/0302440 A1 | 12/2010 | Wober |
| 2010/0304061 A1 | 12/2010 | Ye et al. |
| 2010/0308214 A1 | 12/2010 | Wober |
| 2010/0320444 A1 | 12/2010 | Dutta |
| 2011/0036396 A1 | 2/2011 | Jayaraman |
| 2011/0037133 A1 | 2/2011 | Su et al. |
| 2011/0080508 A1 | 4/2011 | Katsuno et al. |
| 2011/0127490 A1 | 6/2011 | Mi |
| 2011/0133060 A1 | 6/2011 | Yu et al. |
| 2011/0133160 A1 | 6/2011 | Yu et al. |
| 2011/0135814 A1 | 6/2011 | Miyauchi et al. |
| 2011/0139176 A1 | 6/2011 | Cheung et al. |
| 2011/0147870 A1 | 6/2011 | Ang et al. |
| 2011/0180894 A1 | 7/2011 | Samuelson |
| 2011/0195577 A1 | 8/2011 | Kushibiki et al. |
| 2011/0226937 A1 | 9/2011 | Yu |
| 2011/0248315 A1 | 10/2011 | Nam |
| 2011/0249219 A1 | 10/2011 | Evans |
| 2011/0249322 A1 | 10/2011 | Wang |
| 2011/0253982 A1 | 10/2011 | Wang et al. |
| 2011/0272014 A1 | 11/2011 | Mathai et al. |
| 2011/0297214 A1 | 12/2011 | Kim |
| 2011/0309237 A1 | 12/2011 | Seo et al. |
| 2011/0315988 A1 | 12/2011 | Yu et al. |
| 2011/0316106 A1 | 12/2011 | Kim |
| 2012/0009714 A1 | 1/2012 | Mouli |
| 2012/0029328 A1 | 2/2012 | Shimizu |
| 2012/0075513 A1* | 3/2012 | Chipman et al. ............... 348/302 |
| 2012/0196401 A1 | 8/2012 | Graham |
| 2012/0258563 A1 | 10/2012 | Ogino |

FOREIGN PATENT DOCUMENTS

| | | |
|---|---|---|
| JP | 59198413708 | 1/1984 |
| JP | 2002151715 | 5/2002 |
| JP | 2005252210 | 9/2005 |
| JP | 2007201091 | 8/2007 |
| TW | 200845402 | 11/2008 |
| TW | 200915551 | 4/2009 |
| WO | 8603347 | 6/1986 |
| WO | 0002379 | 1/2000 |
| WO | 03107439 A1 | 12/2003 |
| WO | 2005064337 | 7/2005 |
| WO | 2008069565 | 6/2008 |
| WO | 2008079076 | 7/2008 |
| WO | 2008131313 | 10/2008 |
| WO | 2008135905 | 11/2008 |
| WO | 2008135905 A3 | 11/2008 |
| WO | 2008143727 | 11/2008 |
| WO | 2009116018 | 9/2009 |
| WO | 2009137241 | 11/2009 |
| WO | 2010019887 | 2/2010 |
| WO | 2010039631 | 4/2010 |

OTHER PUBLICATIONS

International Search Report and Written Opinion for PCT International Patent Application No. PCT/US2011/060348, mailed Mar. 9, 2012.

International Search Report and Written Opinion for PCT International Patent Application No. PCT/US2011/064635, mailed Apr. 13, 2012.

International Search Report and Written Opinion for PCT International Patent Application No. PCT/US2011/066097, mailed Mar. 12, 2012.

International Search Report and Written Opinion for PCT International Patent Application No. PCT/US2011/067712, mailed May 3, 2012.

William Shockley and H. Queisser, Detailed Balance Limit of Efficiency of p-n Junction Solar Cells, J. of Appl. Physics, Mar. 1961, 32(3).

International Preliminary Report on Patentability for PCT International Application No. PCT/US2010/035722, mailed Nov. 3, 2011.

Baomin Wang and Paul W. Leu, Nanotechology 23 (2012) 194003, 7 pages.

Sangmoo Jeon, et al., Nano Lett. 2012, 12, 2971-2976.

Sangmoo Jeong et al., J. Vac. Sci. Technol. A 30(6), Nov./Dec. 2012.

Sarkar et. al., Integrated polarization-analyzing CMOS image sensor for detecting incoming light ray direction, Sensors Application Symposium (SAS), Mar. 29, 2012, p. 194-199, 1010 IEEE.

Jin-Kon Kim; 'New Functional Nanomaterials Based on Block Copolymers' http://www.ziu.edu.cn/adver/subjectizyhd/jz0707061313.html, Jul. 7, 2011.

Junger, et. al., Polarization- and wavelength-sensitive sub-wavelength structures fabricated in the metal layers of deep submicron CMOS processes, Proc. of SPIE, vol. 7712, 2010.

Sarkar et. al., Integrated polarization-analyzing CMOS image sensor for detecting incoming light ray direction, Sensors Application Symposium (SAS) p. 194-199, 1010 IEEE.

Deptuch et al., Vertically Integrated Circuits at Fermilab, IEEE Transactions on Nuclear Science, Aug. 2010, vol. 54, Issue 4, pp. 2178-2186.

Loose et al., CMOS Detector Technology, Scientific Detector Workshop, Sicily, 2005, Experimental Astronomy, vol. 19, Issue 1-3, pp. 111-134.

Guillaumee, et al., Polarization Sensitive Silicon Photodiodes Using Nanostructured Metallic Grids, Applied Physics Letters 94, 2009.

Gadelrab et al., The Source-Gated Amorphous Silicon Photo-Transistor, IEEE Transactions on Electron Devices, Oct. 1997, vol. 44, No. 10, pp. 1789-1794.

Lin et al., Reducing Dark Current in a High-Speed Si-Based Interdigitated Trench-Electrode MSM Photodetector, IEEE Transactions on Electron Devices, May 2003, vol. 50, No. 5, pp. 1306-1313.

Ye et al., Fabrication Techniques of High Aspect Ratio Vertical Lightpipes Using a Dielectric Photo Mask, SPIE, Proceedings, Feb. 2010, vol. 7591.

CMOS image sensor pixel microlens array optimization using FDTD Solutions, http://www.lumericalcom/ fdtd_microlens/cmos_image_sensor_pixel_microlens.php, pp. 1-2, Jun. 25, 2008.

"CMOS image sensor pixel optical efficiency and optical crosstalk optimization using FDTD Solutions" www.lumerical.com/fdtd_microlens/cmos_image_sensor_pixel_microlens.php, Mar. 19, 2009.

Adler, Nanowire Lawns Make for Sheets of Image Sensors, NewScientist.com, Jul. 28, 2008.

Babinec et al., High-Flux, Low-Power Diamond Nanowire Single-Photon Source Arrays: An Enabling Material for Optical and Quantum Computing and Cryptography, obtained on Jul. 22, 2010 at URL: <http://otd.harvard.edu/technologies/tech.php?case=3702>.

(56) References Cited

OTHER PUBLICATIONS

Baillie et al., 'Zero-space microlenses for CMOS image sensors: optical modeling and lithographic process development', Publication Date May 2004, http://adsabs.harvard.edu/abs/2004SPIE.5377..953B, pp. 1-2.vbTab.
Barclay et al., Chip-Based Microcavities Coupled to NV Centers in Single Crystal Diamond, Applied Physics Letters, Nov. 12, 2009, vol. 95, Issue 19.
Brouri et al., Photon Antibunching in the Flurescence of Individual Colored Centers in Diamond, Optics Letters, Sep. 1, 2000, vol. 25, Issue 17.
Chung, Sung-Wook et al. Silicon Nanowire Devices. Applied Physics Letters, vol. 76, No. 15 (Apr. 10, 2000), pp. 2068-2070.
Ekroll, On the Nature of Simultaneous Color Contrast, Dissertation, University of Kiel, 2005.
Fan et al., Large-Scale, Heterogeneous Integration of Nanowire Arrays for Image Sensor Circuitry, Proceedings of the National Academy of Sciences (PNAS) of the United States of America, Aug. 12, 2008, vol. 105, No. 32.
Fang et al., Fabrication of Slantingly-Aligned Silicon Nanowire Arrays for Solar Cell Applications, Nanotechnology, 2008, vol. 19, No. 25.
Furumiya, et al. "High-sensitivity and no-crosstalk pixel technology for embedded CMOS image sensor"; IEEE Electron Device Letters, vol. 48, No. 10, Oct. 2001.
Gambino et al., 'CMOS Imager with Copper Wiring and Lightpipe,' Electron Devices Meeting, 2006. IEDM '06, International Publication Date: Dec. 11-13, 2006, pp. 1-4.
Garnett et al., Light Trapping in Silicon Nanowire Solar Cells, Nanoletters, Jan. 28, 2010, vol. 10, No. 3, pp. 1082-1087.
Ge et al., Orientation-Controlled Growth of Single-Crystal Silicon-Nanowire Arrays, Advanced Materials, Jan. 18, 2005, vol. 17, No. 1, pp. 56-61.
Hanrath et al., Nucleation and Growth of Germanium Nanowires Seeded by Organic Monolayer-Coated Gold Nanocrystals, J. Am. Chem. Soc., Feb. 20, 2002, vol. 124, No. 7, pp. 1424-1429.
Hanrath et al., Supercritical Fluid-Liquid-Solid (SFLS) Synthesis of Si and Ge Nanowires Seeded by Colloidal Metal Nanocrystals, Advanced Materials, Mar. 4, 2003, vol. 15, No. 5, pp. 437-440.
Hochbaum et al., Controlled Growth of Si Nanowire Arrays for Device Integration, Nano Letters, Mar. 2005, vol. 5, No. 3, pp. 457-460.
Holmes et al., Control of Thickness and Orientation of Solution-Grown Silicon Nanowires, Science, Feb. 25, 2000, vol. 287, No. 5457, pp. 1471-1473.
International Preliminary Report on Patentability for PCT International Patent Application No. PCT/U62009/055963, mailed Mar. 17, 2011.
International Search Report and Written Opinion for PCT International Application No. PCT/US2010/035722, mailed Jul. 20, 2010.
International Search Report and Written Opinion for PCT International Application No. PCT/US2010/035726, mailed Jul. 21, 2010.
International Search Report and Written Opinion for PCT International Application No. PCT/US2010/057227, mailed Jan. 26, 2011.
International Search Report and Written Opinion for PCT International Patent Application No. PCT/US2009/055963, mailed Oct. 15, 2009.vbTab.
International Search Report and Written Opinion for PCT International Patent Application No. PCT/US2010/035727, mailed Sep. 27, 2010.
International Search Report and Written Opinion for PCT International Patent Application No. PCT/US2010/051435, mailed Dec. 3, 2010.
International Search Report and Written Opinion for PCT International Patent Application No. PCT/US2010/059468, mailed Feb. 11, 2011.
International Search Report and Written Opinion for PCT International Patent Application No. PCT/US2010/059491, mailed Feb. 9, 2011.
International Search Report and Written Opinion for PCT International Patent Application No. PCT/US2010/059501, mailed Feb. 15, 2011.
International Search Report and Written Opinion for PCT International Patent Application No. PCT/US2010/059504, mailed Apr. 7, 2011.
Jin-Kon Kim; 'New Functional Nanomaterials Based on Block Copolymers' http:// www.ziu.edu.cn/adver/subjectizyhd/jz0707061313.html.
Juan et al., High Aspect Ratio Polymide Etching Using an Oxygen Plasma Generated by Electron Cyclotron Resonance Source, Journal of Vacuum Science and Technology, Jan./Feb. 1994, vol. 12, No. 1., pp. 422-426.
Kalkofen et al., Atomic Layer Deposition of Boron Oxide As Dopant Source for Shallow Doping of Silicon, Meeting Abstract 943 ,217th ECS Meeting, MA2010-01, Apr. 25-30, 2010, Vancouver Canada, El-Advanced Gate Stack Source / Drain, and Channel Engneering for Si-Based CMOS 6; New Materials, Processes, and Equipment.
Kane, Why Nanowires Make Great Photodetectors, EurekAlert.com article, Apr. 25, 2007.
Kempa, Thomas J. et al. Single and Tandem Axial p-i-n Nanowire Photovoltaic Devices. Nano Letters. 2008, vol. 8, No. 10, 3456-3460.
Kim et al., Electronic Structure of Vertically Aligned Mn-Doped CoFe2O4 Nanowires and Their Application as Humidity Sensors and Photodetectors, Journal of Physical Chemistry C, Apr. 7, 2009.
Law, et al., 'Semiconductor Nanowires and Nanotubes'; Annu. Rev. Mater. Res. 2004, 34:83-122.
Lee et al., Vertical Pillar-Superlattice Array and Graphene Hybrid Light Emitting Diodes, Nano Letters, 2010, vol. 10, pages 2783-2788.
Lin et al., Fabrication of Nanowire Anisotropic Conductive Film for Ultra-fine Pitch Flip Chip Interconnection, Electronic Components and Technology Conference, Jun. 20, 2005, 55th Proceedings, pp. 66-70.
Loncar et al., Diamond Nanotechnology, SPIE Newsroom, May 18, 2010, obtained at url: <http://spie.org/x40194.xml?ArticleID=x40194>.
Lu et al., Growth of Single Crystal Silicon Nanowires in Supercritical Solution from Tethered Gold Particles on a Silicon Substrate, NanoLetters, Jan. 2003, vol. 3, No. 1, pp. 93-99.
Lugstein et al., Ga/Au Alloy Catalyst for Single Crystal Silicon-Nanowire Epitaxy, Applied Physics Letters, Jan. 8, 2007, vol. 90, No. 2, pp. 023109-1-023109-3.
Madou, Properties and Growth of Silicon, Including Crystalline Silicon, Fundamentals of Microfabrication, 2nd Ed., CRC Press, 2002, pp. 125-204.
Makarova et al., Fabrication of High Density, High-Aspect-Ratio Polyimide Nanofilters, Journal of Vacuum Science and Technology, Nov./Dec. 2009, vol. 27, No. 6., pp. 2585-2587.
Morales et al., A Laser Ablation Method for the Synthesis of Crystalline Semiconductor Nanowires, Science, Jan. 9, 1998, vol. 279, pp. 208-211.
N.L. Dmitruk, et al.; 'Modeling and Measurement of Optical Response of 1D Array of Metallic Nanowires for Sensing and Detection Application'; 26th International Conference on Microelectronics (MIEL 2008), NIS, Serbia, May 11-14, 2008.
Nguyen et al., Deep Reactive Ion etching of Polyimide for Microfluidic Applications, Journal of the Korean Physical Society, Sep. 2007, vol. 51, No. 3, pp. 984-988.
Pain et al., A Back-Illuminated Megapixel CMOS Image Sensor, IEEE Workshop on Charge-Coupled Devices and Advanced Image Sensors, Karuizawa, Japan, Jun. 9-11, 2005, Jet Propulsion Laboratory, National Aeronautics and Space Administration, Pasadena California.
Parraga et al., Color and Luminance Information in Natural Scenes, Journal of Optical Society of America A, Optics, Image, Science and Vision, Jun. 1998, vol. 15, No. 6.
Rosfjord et al., Nanowire Single-Photon Detector with an Integrated Optical Cavity and Anti-Reflection Coating, Optics Express: The International Electronic Journal of Optics, Jan. 23, 2006, vol. 14, No. 2, pp. 527-534.
Rugani, First All-Nanowire Sensor, Technology Review, Aug. 13, 2008, Published by MIT.

(56) References Cited

OTHER PUBLICATIONS

Rutter, Diamond-Based Nanowire Devices Advance Quantum Science, SEAS Communications, Feb. 14, 2010, obtained at url:<http://news.harvard.edu/gazette/story/2010/02/digging-deep-into-diamonds/>.

Schmidt et al., Realization of a Silicon Nanowire Vertical Surround-Gate Field-Effect Transistor, Small, Jan. 2006, vol. 2, No. 1, pp. 85-88.

Song et al., Vertically Standing Ge Nanowires on GaAs(110) Substrates, Nanotechnology 19, Feb. 21, 2008.

T. H. Hsu, et al. 'Light Guide for Pixel Crosstalk Improvement in Deep Submicron CMOS Image Sensor'; IEEE Electron Device Letters, vol. 25, No. 1, Jan. 2004.

Thelander et al., Nanowire-Based One-Dimensional Electronics, Materials Today, Oct. 2006, vol. 9, No. 10, pp. 28-35.

Trentler, Timothy J. et al. Solution-Liquid-Solid Growth of Cyrstalline III-V Semiconductors: An Analogy to Vapor Liquid-Solid Growth. vol. 270(5243), Dec. 15, 1995, pp. 1791-1794.

Tseng, et al. 'Crosstalk improvement technology applicable to 0.14μm CMOS image sensor'; IEEE International Electron Devices Meeting, Dec. 13-15, 2004; IEDM Technical Digest, pp. 997-1000. vbTab.

Verheijen, Marcel A. et al. Growth Kinetics of Heterostructured GaP-GaAs Nanowires. J. Am. Chem. Soc. 2006, 128, 1353-1359.

Wagner, R.S. and Ellis, W.C. Vapor-Liquid-Solid Mechanism of Single Crystal Growth. Applied Physics Letters. vol. 4, No. 5 (Mar. 1, 1964), pp. 89-90.

Wong et al., Lateral Nanoconcentrator Nanowire Multijunction Photovoltaic Cells, GCEP Progress report, Apr. 20, 2009, pp. 1-18.

Zhang et al., Ultrahigh Responsivity Visible and Infrared Detection Using Silicon Nanowire Phototransistors, Nanoletters, May 14, 2010, vol. 10, No. 6, pp. 2117-2120.

International Search Report and Written Opinion for PCT International Patent Application No. PCT/US2009/063592, mailed Jan. 13, 2010.

International Search Report and Written Opinion for PCT International Patent Application No. PCT/US2010/051446, mailed Jan. 3, 2011.

Ozgur Yavuzcetin, et al.; 'Index-tuned Anti-reflective Coating using a Nanostructured Metamaterial'; http://www.umass.edu/research/rld/bioportal/vuewtech.php?tid=40, Feb. 28, 2007.

Reynard Corporation; 'Anti-Reflection Coatings (AR)', http://www.reynardcorp.com/coating_anti_reflection.php, Jun. 4, 2009.

Shimizu et al., Homoepitaxial Growth of Vertical Si Nanowires on Si(100) Substrate using Anodic Aluminum Oxide Template, (abstract only), Materials Research Society, Fall 2007.

Wang, Introduction to Nanotechnology—Where Opportunities arise Great Future Being Built from Small Things, Fall 2008.

International Preliminary Report and Written Opinion re PCT/US2010/059468, mailed Jun. 21, 2012.

International Preliminary Report and Written Opinion re PCT/US2010/059491, mailed Jun. 21, 2012.

International Preliminary Report and Written Opinion re PCT/US2010/059496, mailed Jun. 21, 2012.

International Preliminary Report and Written Opinion re PCT/US2010/059504, mailed Jun. 21, 2012.

International Search Report and Written Opinion re PCT/US2011/57325, mailed Jun. 22, 2012.

U.S. Office Action for U.S. Appl. No. 12/573,582, dated Jun. 28, 2012.

Taiwanese Office Action of Taiwan Patent Application No. 099116881, issued Jul. 18, 2013 (8 pages).

Canadian Office Action of Canadian Application No. 3,676,376, dated Oct. 11, 2013.

Catrysse, et al., An Integrated Color Pixel in 0.18pm CMOS Technology, Proceedings IEDM 2001, pp. 559-562.

Choi et al., Optimization of sidewall roughness in silica waveguides to reduce propagation losses, May 2001, Lasers and Electro-Optics, 2001. CLEO '01. Technical Digest. Summaries of papers presented at the Conference on, pp. 175-176.

Geyer et al., Model for the Mass Transport during Metal-Assisted Chemical Etching with Contiguous Metal Films as Catalysts, J. Phys. Chem. C 2012, 116, 13446-13451.

Hopkins, Addressing sidewall roughness using dry etching silicon and Si02, Jul. 1, 2004, ElectroIQ, vol. 47, Issue 7.

Mei-Ling Kuo et al. "Realization of a near-perfect antireflection coating for silicon solar energy utilization" (Nov. 1, 2008, vol. 33, No. 21, Optics Letters).

Mukhopadhyay, When PDMS Isn't the Best, American Chemical Society, May 1, 2007.

Seo, et. al., "Multicolored vertical silicon nanowires," Nano Letters, vol. 11 issue 4, pp. 1851-1856, 2010.

U.S. Final Office Action for U.S. Appl. No. 12/966,514, mailed Mar. 19, 2013, 50 pages.

U.S. Final Office Action for U.S. Appl. No. 13/494,661, mailed Mar. 7, 2013, 10 pages.

* cited by examiner

1005

1006

1007

1008 and 1009

1010

131

1011

132

1012

134
133

1013

1014

132

1015

2005

2006

2007

2008

2009

2010

2011

Annealing

2012

2013

2014

4012

4013

4014

4015

POLARIZED LIGHT DETECTING DEVICE AND FABRICATION METHODS OF THE SAME

CROSS-REFERENCE TO RELATED APPLICATIONS

This application is related to U.S. patent application Ser. Nos. 61/266,064, 61/357,429, 61/360,421, 12/204,686 (granted as U.S. Pat. No. 7,646,943), 12/270,233, 12/472,264, 12/472,271, 12/478,598, 12/573,582, 12/575,221, 12/633,297, 12/633,305, 12/633,313, 12/633,318, 12/633,323, 12/621,497, 12/648,942, 12/910,664, 12/945,492, 12/966,514, 12/966,535, 12/966,573, 12/967,880, 12/974,499 and 12/982,269, the disclosures of which are hereby incorporated by reference in their entirety.

BACKGROUND

Polarization is a property of certain types of waves that describes the orientation of their oscillations. Electromagnetic waves including visible light can exhibit polarization. By convention, the polarization of light is described by specifying the orientation of the light's electric field at a point in space over one period of the oscillation. When light travels in free space, in most cases it propagates as a transverse wave, i.e. the polarization is perpendicular to the light's direction of travel. In this case, the electric field may be oriented in a single direction (linear polarization), or it may rotate as the wave travels (circular or elliptical polarization). In the latter cases, the oscillations can rotate either towards the right or towards the left in the direction of travel. Depending on which rotation is present in a given wave it is called the wave's chirality or handedness. Polarization of fully polarized light can be represented by a Jones vector. The x and y components of the complex amplitude of the electric field of light travel along z-direction, $E_x(t)$ and $E_y(t)$, are represented as $$\begin{pmatrix} E_x(t) \\ E_y(t) \end{pmatrix} = E_0 \begin{pmatrix} E_{0x} e^{i(kz-\omega t+\phi_x)} \\ E_{0y} e^{i(kz-\omega t+\phi_x)} \end{pmatrix} = E_0 e^{i(kz-\omega t)} \begin{pmatrix} E_{0x} e^{i\phi_x} \\ E_{0y} e^{i\phi_y} \end{pmatrix} \cdot \begin{pmatrix} E_{0x} e^{i\phi_x} \\ E_{0y} e^{i\phi_y} \end{pmatrix}$$

is the Jones vector. Polarization of light with any polarization, including unpolarized, partially polarized, and fully polarized light, can be described by the Stokes parameters, which are four mutually independent parameters.

A device that can detect polarization of light, or even measure the light's Jones vector or Stokes parameters can be useful in many application.

SUMMARY

According to an embodiment, a device operable to detect polarized light comprises: a substrate; a first subpixel; a second subpixel adjacent to the first subpixel; a first plurality of features in the first subpixel and a second plurality of features in the second subpixel, wherein the first plurality of features extend essentially perpendicularly from the substrate and extend essentially in parallel in a first direction parallel to the substrate and the second plurality of features extend essentially perpendicularly (i.e. at least 85°) from the substrate and extend essentially in parallel (i.e. at most 5°) in a second direction parallel to the substrate; wherein the first direction and the second direction are different; the first plurality of features and the second plurality of features react differently to the polarized light. The term "polarized light" as used herein means light with polarization.

According to an embodiment, the polarized light has linear polarization, circular or elliptical polarization. "Linear polarization" as used herein means the electric field of light is confined to a given plane along the direction of propagation of the light. "Circular polarization" as used herein means the electric field of light does not change strength but only changes direction in a rotary type manner. "Elliptical polarization" as used herein means electric field of light describes an ellipse in any fixed plane intersecting, and normal to, the direction of propagation of the light.

According to an embodiment, the first plurality of features is equally spaced from each other.

According to an embodiment, the first plurality of features comprises at least 2 features.

According to an embodiment, the first plurality of features has a pitch of about 0.5 micron to about 5 microns, a height of about 0.3 micron to 10 microns, an aspect ratio of at least 4:1, preferably at least 10:1, or a combination thereof.

According to an embodiment, space between features of the first plurality of features is filled with a transparent material.

According to an embodiment, each of the first plurality of features comprises a p-i-n diode or forms a p-i-n diode with the substrate, and wherein the p-i-n diode is functional to convert at least a portion of the polarized light to an electrical signal. A p-i-n diode means a diode with a wide, lightly doped or intrinsic semiconductor region between a p-type semiconductor and an n-type semiconductor region. An intrinsic semiconductor, also called an undoped semiconductor or i-type semiconductor, is a substantially pure semiconductor without any significant dopant species present. A heavily doped semiconductor is a semiconductor with such a high doping level that the semiconductor starts to behave electrically more like a metal than as a semiconductor. A lightly doped semiconductor is a doped semiconductor but not have a doping level as high as a heavily doped semiconductor. In a lightly doped semiconductor, dopant atoms create individual doping levels that can often be considered as localized states that can donate electrons or holes by thermal promotion (or an optical transition) to the conduction or valence bands respectively. At high enough impurity concentrations (i.e. heavily doped) the individual impurity atoms may become close enough neighbors that their doping levels merge into an impurity band and the behavior of such a system ceases to show the typical traits of a semiconductor, e.g. its increase in conductivity with temperature.

According to an embodiment, the substrate comprises electrical components configured to detect the electrical signal.

According to an embodiment, the device further comprises a first transparent electrode disposed on the first subpixel and electrically connected to each of the first plurality of features, and a second transparent electrode disposed on the second subpixel and electrically connected to each of the second plurality of features, wherein the first and second transparent electrodes are separate. The term "transparent" as used herein means a transmittance of at least 70%.

According to an embodiment, the device further comprises a reflective material deposited on areas of the substrate between features of the first plurality of features. A reflective material is a material with a reflectance of at least 50%.

According to an embodiment, each of the first plurality of features comprises an intrinsic semiconductor layer or a first lightly doped semiconductor layer, and a heavily doped semiconductor layer; the substrate comprises a second lightly doped semiconductor layer; wherein the second lightly doped semiconductor layer is an opposite type from the heavily doped semiconductor layer; intrinsic semiconductor layer or a first lightly doped semiconductor layer is disposed on the second lightly doped semiconductor layer; and the heavily doped semiconductor layer is disposed on the intrinsic semiconductor layer or the first lightly doped semiconductor layer; wherein the heavily doped semiconductor layer, the intrinsic layer or the first lightly doped semiconductor layer, and the heavily doped semiconductor layer form a p-i-n diode. One semiconductor having an opposite type from another semiconductor means the former is n type if the latter is p type or, the former is p type if the latter is n type.

According to an embodiment, each of the first plurality of features comprises a core of intrinsic semiconductor or lightly doped semiconductor, and a shell of heavily doped semiconductor; the substrate comprises a lightly doped semiconductor layer; wherein the lightly doped semiconductor layer is an opposite type from the shell; the core is disposed on the lightly doped semiconductor layer; the shell is conformally disposed over the core; wherein the shell, the core and the lightly doped semiconductor layer form a p-i-n diode.

According to an embodiment, each of the first plurality of features comprises a core of lightly doped semiconductor, an intermediate shell of intrinsic semiconductor and an outer shell of doped semiconductor; wherein the intermediate shell is conformally disposed over the core; the outer shell is conformally disposed over the intermediate shell; the outer shell is of an opposite type from the core; wherein the outer shell, the intermediate shell and the core form the p-i-n diode.

According to an embodiment, each of the first plurality of features comprises a first heavily doped semiconductor layer, a lightly doped semiconductor layer or intrinsic semiconductor layer, a second heavily doped layer; wherein the first heavily doped semiconductor layer is disposed on the lightly doped semiconductor layer or intrinsic semiconductor layer; the lightly doped semiconductor layer or intrinsic semiconductor layer is disposed on the second heavily doped layer; the first heavily doped layer is of an opposite type from the second heavily doped layer; wherein the first heavily doped layer, the lightly doped semiconductor layer or intrinsic semiconductor layer and the second heavily doped layer form the p-i-n diode.

According to an embodiment, a polarization detector array comprises any of the device above, and electronic circuitry functional to detect the electrical signal.

According to an embodiment, the electronic circuitry is further functional to calculate an interpolation of subpixels of the device, adjust a gain and/or calculate Stoke's parameters.

According to an embodiment, the device comprises a first subpixel, a second subpixel, a third subpixel and a fourth subpixel, wherein features on the second, third and fourth subpixels extend in transverse directions at 45°, 90° and −45° relative to a transverse direction in which features on the first subpixel extend.

According to an embodiment, a method of fabricating a device operable to detect polarized light comprising a substrate, a first subpixel, a second subpixel adjacent to the first subpixel, a first plurality of features in the first subpixel and a second plurality of features in the second subpixel, wherein the first plurality of features extend essentially perpendicularly from the substrate and extend essentially in parallel in a first direction parallel to the substrate and the second plurality of features extend essentially perpendicularly from the substrate and extend essentially in parallel in a second direction parallel to the substrate, wherein the first direction and the second direction are different and wherein the first plurality of features and the second plurality of features react differently to the polarized light; the method comprises: lithography, ion implantation, annealing, evaporation, atomic layer deposition, chemical vapor deposition, dry etch or a combination thereof.

DETAILED DESCRIPTION

In the following detailed description, reference is made to the accompanying drawings, which form a part thereof. In drawings, similar symbols typically identify similar components, unless the context dictates otherwise. The illustrate embodiments described in the detailed description, drawings, and Claims are not meant to be limiting. Other embodiments may be utilized, and other changes may be made, without departing from the spirit or scope of the subject matter presented here.

This disclosure is drawn to, among other things, methods of use, methods of fabrication, apparatuses, systems, and devices related to a device operable to detect and distinguish light of different polarization. According to an embodiment, the device comprises a substrate having a plurality of regions defined thereon (hereafter referred to as "subpixels"; a group of related "subpixels" may be referred to as a "pixel"). In each subpixel, the device comprises a plurality of features extending essentially perpendicularly from the substrate, wherein the plurality of features also extend essentially in parallel in a direction parallel to the substrate (hereafter referred to as a "transverse direction"). The term "feature" used herein means a structure whose dimensions in a direction perpendicular to the substrate (hereafter referred to as the "normal direction") and in the transverse direction are substantially greater than a dimension of the structure in a direction perpendicular to both the normal direction and the transverse direction (hereafter referred to as the "thickness direction"). A feature can have any suitable shape in a cross-section parallel to the substrate, such as a rectangle, an ellipse, convex-convex (i.e. like a double-convex lens), concave-concave (i.e. like a double-concave lens), plano-convex (i.e. like a plano-convex lens), plano-concave (i.e. like a plano-concave lens). The plurality of features can be equally or unequally spaced from each other. The plurality of features in different subpixels are functional to react differently to light with a same polarization. Here, the term "react" is meant to broadly encompass absorbing, reflecting, coupling to, detecting, interacting with, converting to electrical signals, etc. The plurality of features in a first subpixel extends in a first transverse direction; the plurality of features in a second subpixel extends in a second transverse direction, wherein the first and second pixels are adjacent and the first transverse direction is different from the second transverse direction.

Figure 1:
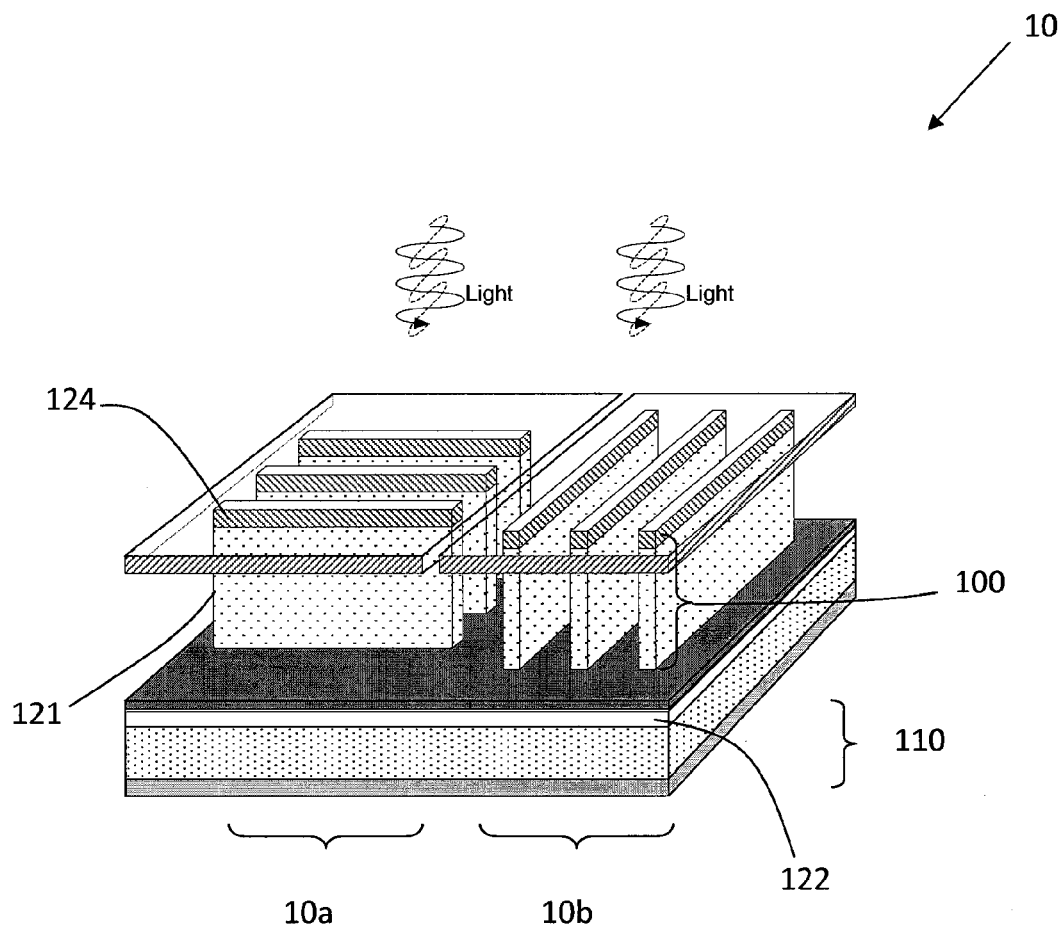
FIG. 1 is a perspective view of the device according one embodiment.

FIG. 1 shows a device 10 according to one embodiment. For brevity, two subpixels 10a and 10b of a substrate 110 are illustrated. The device 10, however, can comprise a plurality of pixels such as more than 100, more than 1000, more than 1000000. The subpixels preferably have a pitch of about 1 micron to 100 microns (more preferably 5 microns). In each of the subpixels 10a and 10b, the device 10 comprises a plurality of features 100 (e.g. at least 2 features), respectively. The features 100 in the subpixel 10a and the features 100 in the subpixel 10b extend in different transverse directions. The features 100 preferably have a pitch (i.e. spacing between adjacent features 100 in the thickness direction thereof) of about 0.5 to 5 microns (further preferably about 1 micron), a height (i.e. dimension in the normal direction) of about 0.3 to 10 microns (further preferably about 5 micron) and an aspect ratio (i.e. ratio of a dimension in the transverse direction to a dimension in the thickness direction) of at least 4:1, preferably at least 10:1. Each of the features 100 forms a p-i-n diode with the substrate 110, the p-i-n diode being functional to convert at least a portion of light impinged thereon to an electrical signal. Each feature 100 comprises a heavily doped semiconductor layer 124 disposed on a lightly doped semiconductor layer or intrinsic semiconductor layer 121. The substrate 110 comprises another lightly doped semiconductor layer 122 of an opposite type from the heavily doped semiconductor layer 124. The lightly doped semiconductor layer or intrinsic semiconductor layer 121 of the feature 100 is disposed on the lightly doped semiconductor layer 122. The layers 121, 122 and 124 form the p-i-n diode. Space between the features 100 can be filled with a transparent material. The device 10 preferably further comprises electrical components configured to detect the electrical signal from the features 100, for example, a transparent electrode disposed on each subpixel and electrically connected to all features 100 therein. The transparent electrode on each subpixel preferably is separate from the transparent electrode on adjacent subpixels. A reflective material can be deposited on areas of the substrate 110 between the features 100. The substrate 110 can have a thickness in the normal direction of about 5 to 700 microns (preferably 120 microns).

Figure 2:
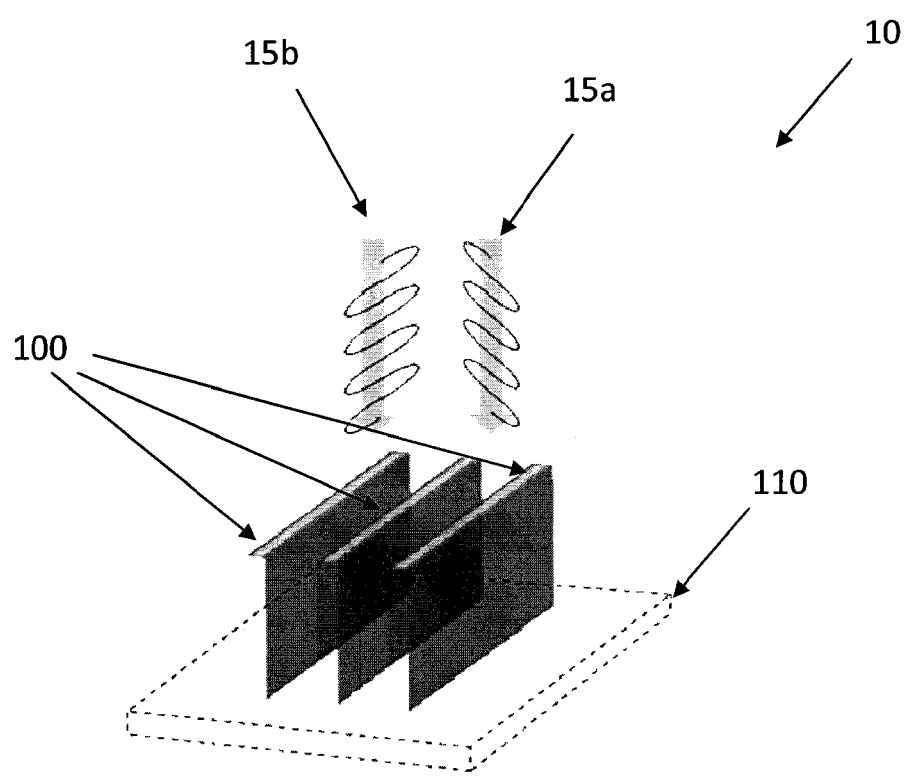
FIG. 2 shows a schematic of the features in one subpixel when light with different polarization impinges thereon.

FIG. 2 shows a schematic of the features 100 in one subpixel when light with different polarization impinges thereon. For light 15a with a wavelength of about 400 nm and a linear polarization essentially in the thickness direction of the features 100, the absorptance of the features 100 is about 35%. In contrast, for light 15b with the same wavelength as light 15a and a linear polarization essentially in the transverse direction of the features 100, the absorptance of the features 100 is about 95%.

Figure 3:
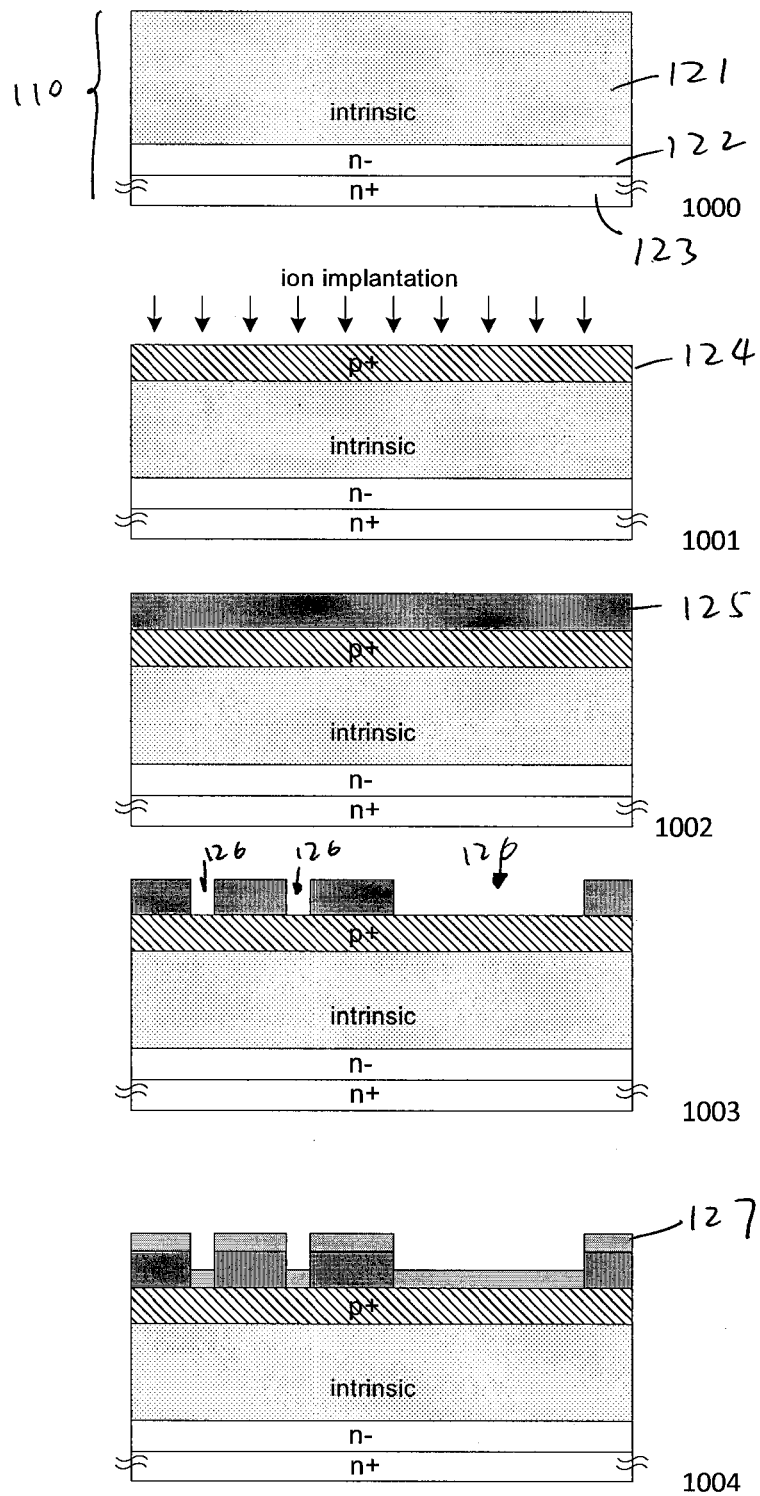
FIG. 3 shows a method of fabricating the device of FIG. 1.
Figure 3:
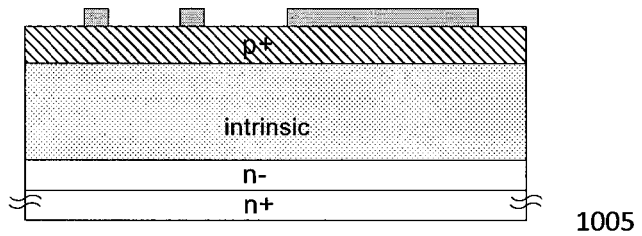
Figure 3:
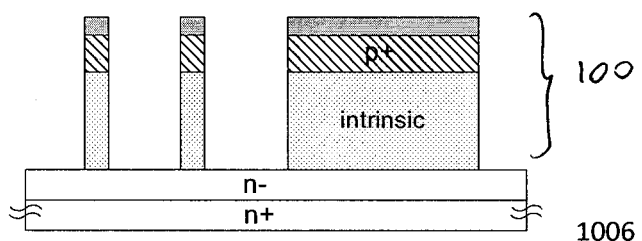
Figure 3:
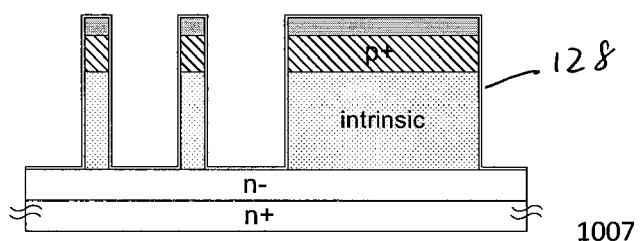
Figure 3:
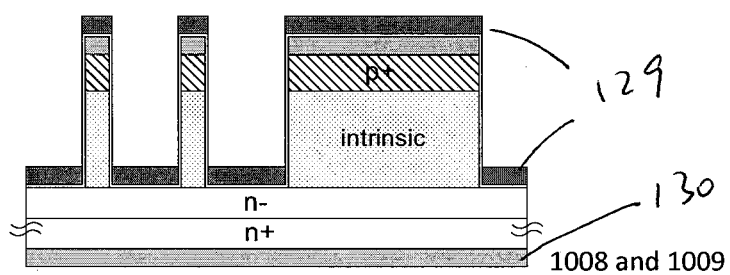
Figure 3:
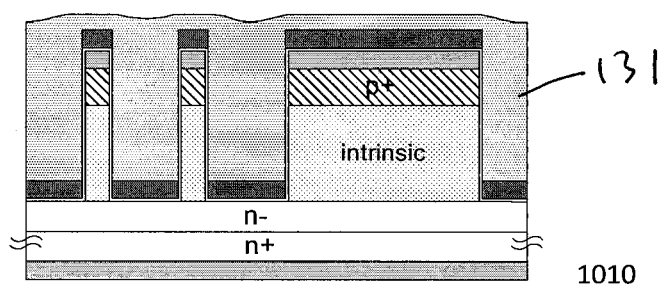
Figure 3:
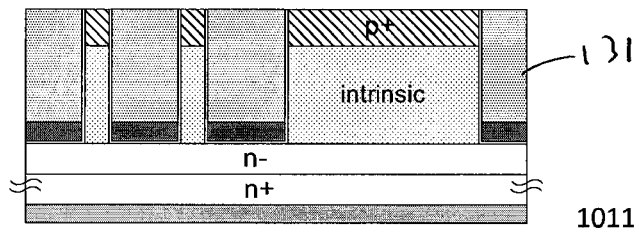
Figure 3:
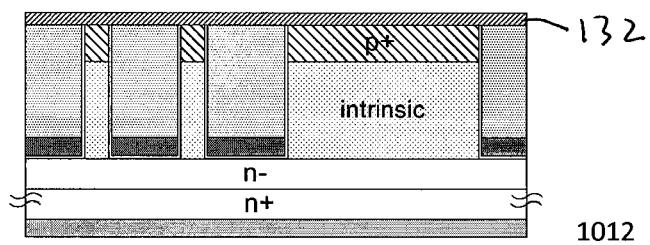
Figure 3:
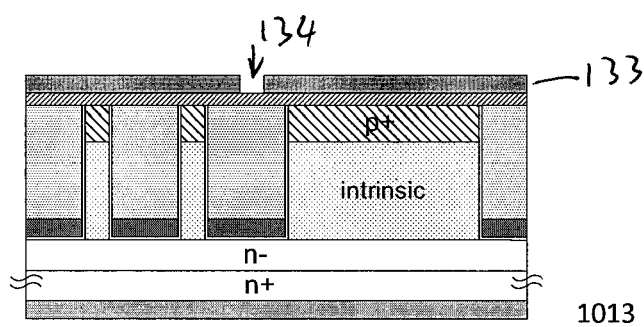
Figure 3:
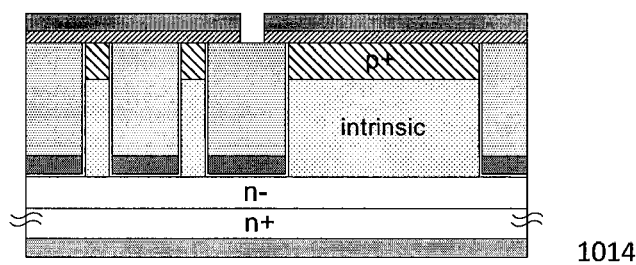
Figure 3:
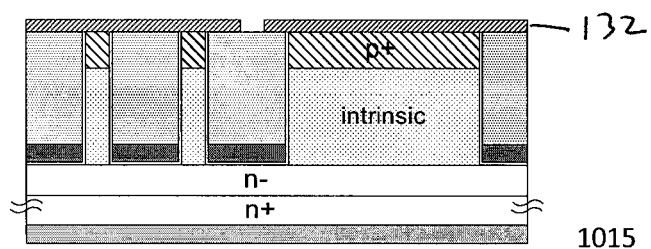
Figure 3:
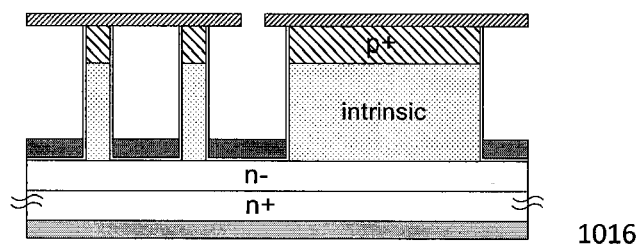

FIG. 3 shows an exemplary method of fabrication of the device 10.

In step 1000, a silicon substrate 110 is provided, wherein the silicon substrate comprises an intrinsic layer or a lightly doped n type silicon epitaxial layer 121, a heavily doped n type layer 123 and a lightly doped n type layer 122 sandwiched between the layers 121 and 123. A substrate of semiconductor material other than silicon (e.g. III-V or II-VI group compound semiconductor) can also be used.

In step 1001, a heavily doped p type layer 124 is fabricated on the layer 121 by a method such as ion implantation and subsequent annealing. An exemplary dopant suitable for use in the ion implantation is boron or boron difluoride.

In step 1002, a resist layer 125 (e.g. a photoresist or an e-beam resist) is deposited on the heavily doped p type layer 124, by a suitable method such as spin coating.

In step 1003, a pattern is formed in the resist layer 125 using a lithography technique (e.g. photolithrograph or e-beam lithography) by removing portions 126 of the resist layer 125. The heavily doped p type layer 124 is exposed under the removed portions 126. The pattern corresponds to shapes and positions of the features 100.

In step 1004, a metal layer 125 is deposited on the resist layer 125 and the exposed portions of the heavily doped p type layer 124, using a suitable technique such as thermal evaporation, e-beam evaporation, and sputtering. Exemplary metal suitable for use in the metal layer 125 are aluminum, gold, chromium, silver, copper, titanium, nickel or a combination thereof.

In step 1005, remainder of the resist layer 125 and portions of the metal layer 125 thereon are lift-off by a suitable technique such as plasma ashing and dissolution in a suitable solvent.

In step 1006, features 100 are formed by etching into the substrate 110 using a suitable technique, such as dry etching with remainder of the metal layer 125 as etch mask, until portions of the lightly doped n type layer 122 not directly below the remainder of the metal layer 125 are exposed. The features 100 now comprise remainder of the layers 121 and 124.

In step 1007, a layer of oxide 128 (e.g. $HfO_2$, $SiO_2$, $Al_2O_3$) is deposited isotropically over the features 100 and exposed portions of the layer 122, using suitable technique such as atomic layer deposition (ALD) and chemical vapor deposition (CVD). The layer of oxide 128 is functional to passivate surfaces of the features 100.

In step 1008, a metal layer 130 is deposited on the heavily doped n type layer 123 using a suitable technique such as thermal evaporation, e-beam evaporation, and sputtering. Exemplary metal suitable for use in the metal layer 130 are aluminum, gold, chromium, silver, copper, titanium, nickel or a combination thereof. A rapid thermal annealing can be conducted following the deposition of the metal layer 130 to form an Ohmic contact between the metal 130 and the heavily doped n type layer 123.

In step 1009, a reflective layer 129 is deposited anisotropically on and between the features 100 such that sidewalls of the features 100 are preferably free of the reflective layer 129. The reflective layer 129 can be deposited by thermal evaporation or e-beam evaporation. Exemplary metal suitable for use in the reflective layer 129 are aluminum, gold, chromium, silver, copper, titanium, nickel or a combination thereof.

In step 1010, a sacrificial layer 131 preferably with a refractive index lower than that of the features 100 is deposited by spin coating or evaporation to fill space between the features 100. The sacrificial layer 131 can be a suitable material such as polyimide or oxide.

In step 1011, the sacrificial layer 131 is planarized using a suitable technique such as chemical mechanical polishing (CMP) until the heavily doped p type layer 124 of the features 100 is exposed.

In step 1012, a transparent conductive oxide (TCO) layer 132 is deposited on the sacrificial layer 131 and the exposed heavily doped p type layer 124 of the features 100, using a suitable method such as thermal evaporation, e-beam evaporation, and sputtering. The TCO layer can comprise one or more suitable materials such as indium tin oxide, aluminum zinc oxide, zinc indium oxide, zinc oxide and graphene.

In step 1013, another resist layer 133 is deposited on the TCO layer 132 using a technique such as spin-coating. A pattern is formed in the resist layer 133 using a lithography technique (e.g. photolithrograph or e-beam lithography) by removing portions 134 of the resist layer 133. The TCO layer 132 is exposed under the removed portions 134. The pattern corresponds to gaps to be made in the TCO layer 132 for electrically separating the TCO layer 132 into transparent electrodes for each subpixel.

In step 1014, the TCO layer 132 is dry etched using the resist layer 133 as etch mask until portions of the sacrificial layer 131 is exposed in the removed portions 134 of the resist layer 133.

In step 1015, remainder of the resist layer 133 is removed by plasma ashing or dissolution in a suitable solvent.

In step 1016, the sacrificial layer 131 is optionally removed by a suitable method such as wet etching. For example, polyimide can be removed by a suitable photoresist developer. A thermal annealing (e.g. at 450° C. for 30 minutes) can be applied to form an Ohmic contact between the TCO layer 132 and the features 100.

Figure 4:
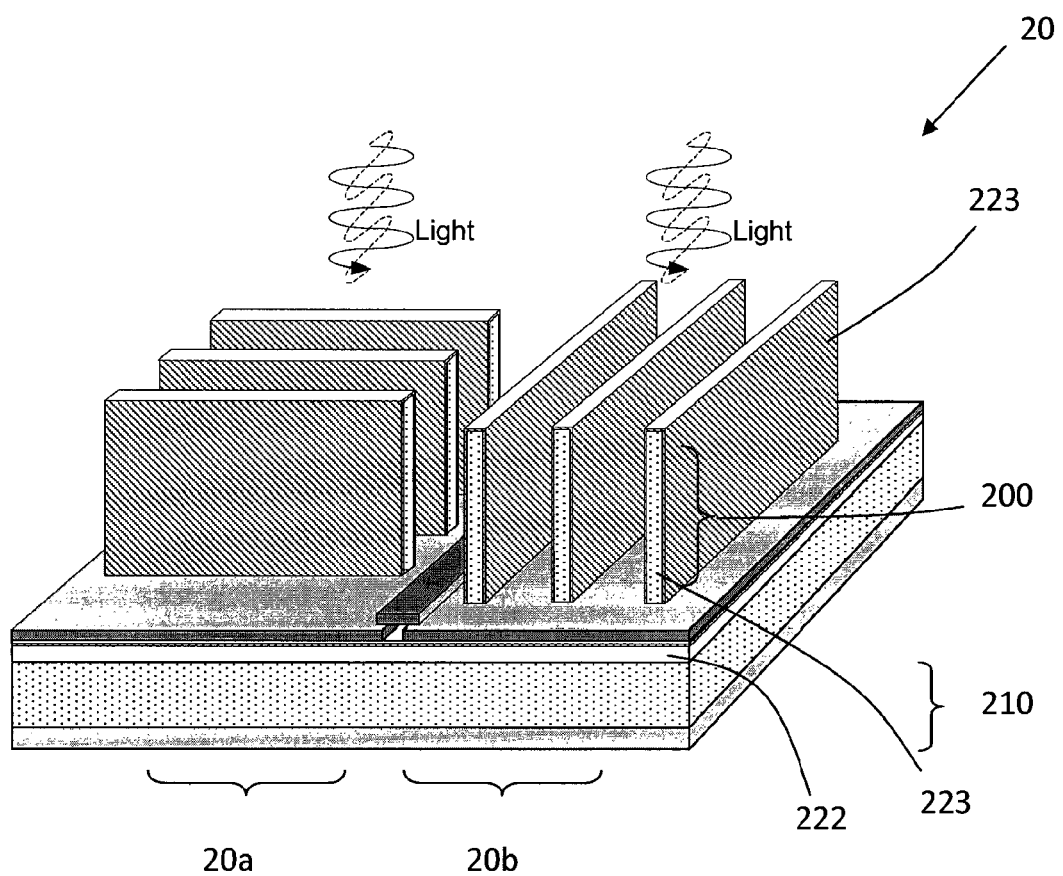
FIG. 4 is a perspective view of the device according one embodiment.

FIG. 4 shows a device 20 according to one embodiment. For brevity, two subpixels 20a and 20b of a substrate 210 are illustrated. The device 20, however, can comprise a plurality of pixels such as more than 100, more than 1000, more than 1000000. The subpixels preferably have a pitch of about 1 micron to 100 microns (more preferably 5 microns). In each of the subpixels 20a and 20b, the device 20 comprises a plurality of features 200 (e.g. at least 2 features), respectively. The features 200 in the subpixel 20a and the features 200 in the subpixel 20b extend in different transverse directions. The features 200 preferably have a pitch (i.e. spacing between adjacent features 100 in the thickness direction thereof) of about 0.5 to 5 microns (further preferably about 1 micron), a height (i.e. dimension in the normal direction) of about 0.3 to 10 microns (further preferably about 5 micron) and an aspect ratio (i.e. ratio of a dimension in the transverse direction to a dimension in the thickness direction) of at least 4:1, preferably at least 10:1. Each of the features 200 forms a p-i-n diode with the substrate 210, the p-i-n diode being functional to convert at least a portion of light impinged thereon to an electrical signal. Each feature 200 comprises a core 221 of lightly doped semiconductor or intrinsic semiconductor, and a shell 223 of heavily doped semiconductor, the shell 223 being conformally disposed over the core 221. The substrate 210 comprises a lightly doped semiconductor layer 222 of an opposite type from the shell 223. The core 221 is disposed on the lightly doped semiconductor layer 222. The shell 223, core 221 and layer 222 form the p-i-n diode. Space between the features 200 can be filled with a transparent material. The device 20 preferably further comprises electrical components configured to detect the electrical signal from the features 200, for example, an electrode disposed between and electrically connected to the features 200 on each subpixel. The electrode disposed between the features 200 on each subpixel preferably is separate from the electrode disposed between the features 200 on adjacent subpixels. The electrode can also function as a reflective layer. The substrate 210 can have a thickness in the normal direction of about 5 to 700 microns (preferably 120 microns).

Figure 5:
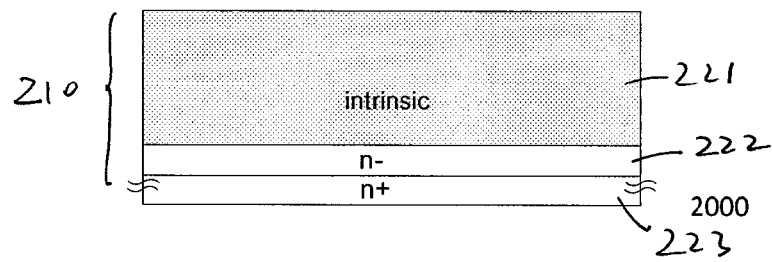
FIG. 5 shows a method of fabricating the device of FIG. 4.
Figure 5:
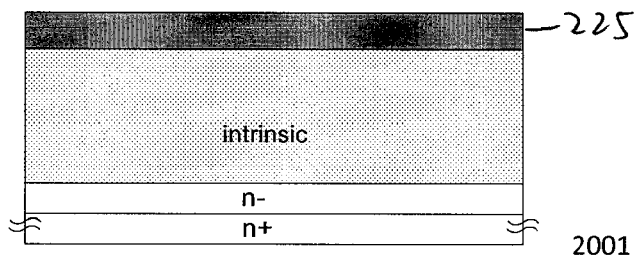
Figure 5:
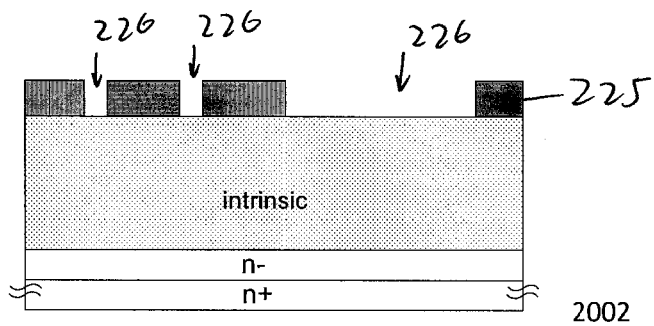
Figure 5:
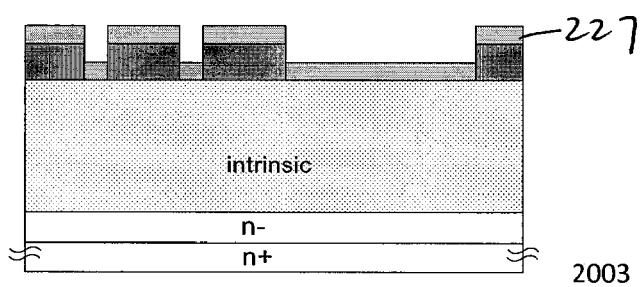
Figure 5:
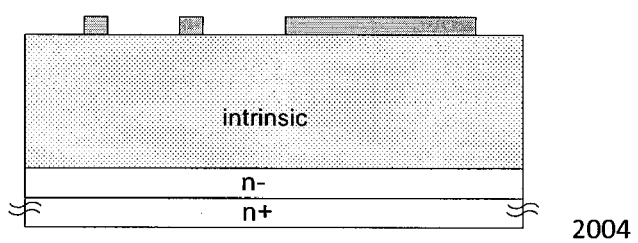
Figure 5:
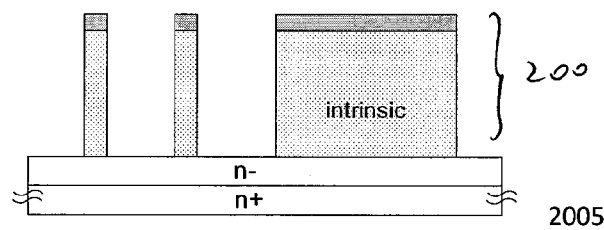
Figure 5:
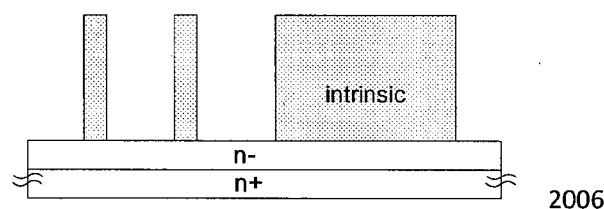
Figure 5:
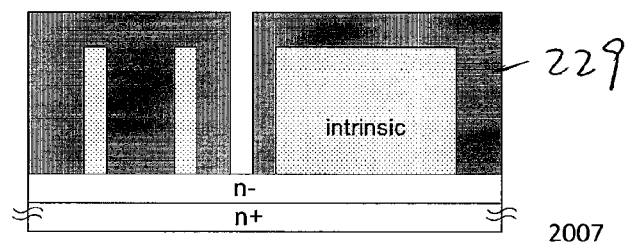
Figure 5:
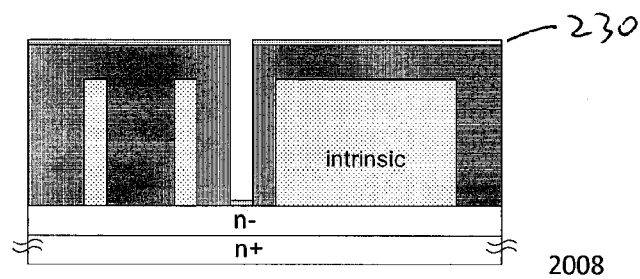
Figure 5:
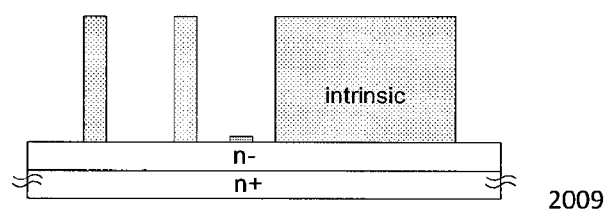
Figure 5:
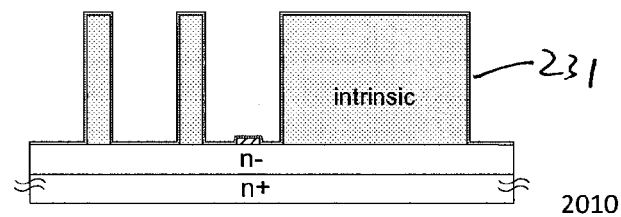
Figure 5:
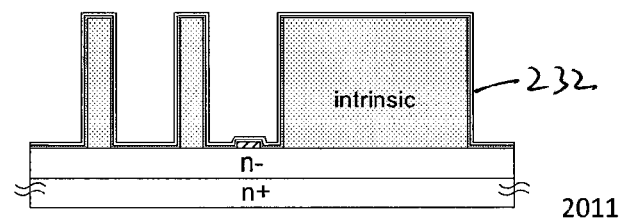
Figure 5:
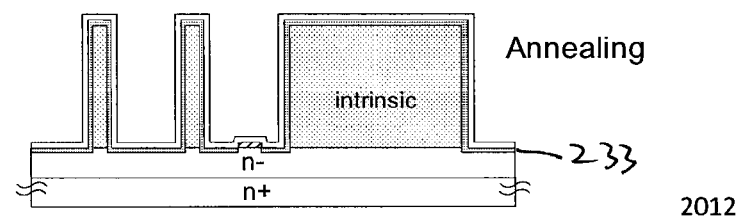
Figure 5:
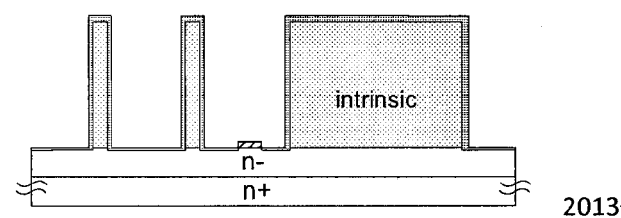
Figure 5:
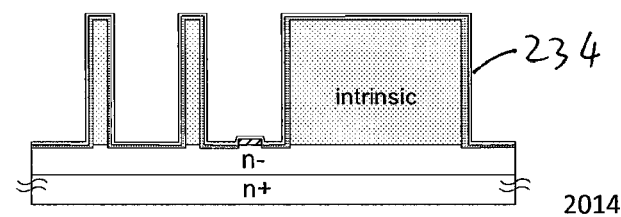
Figure 5:
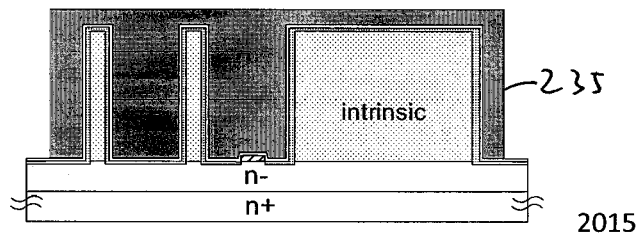
Figure 5:
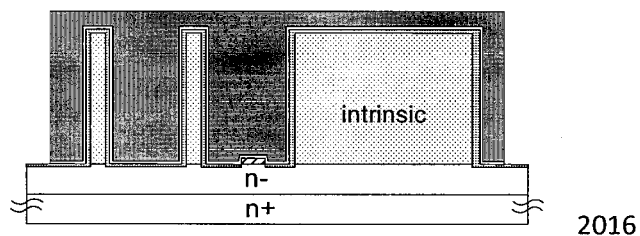
Figure 5:
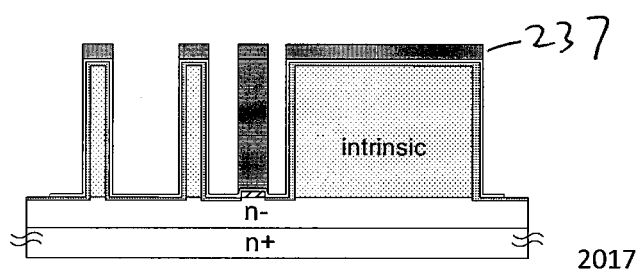
Figure 5:
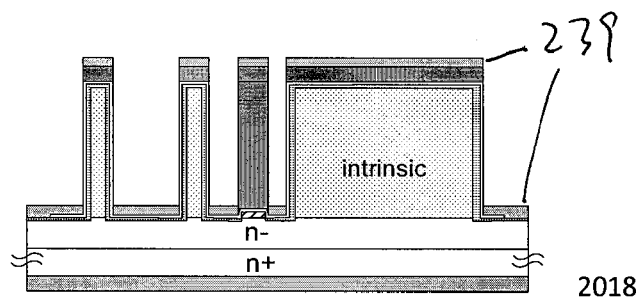
Figure 5:
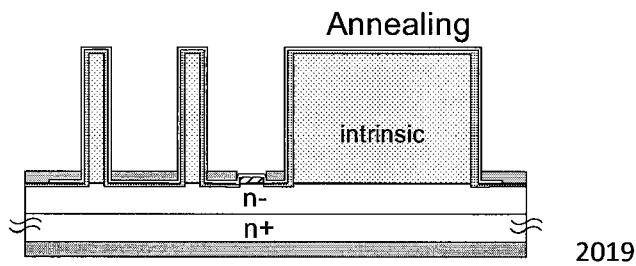
Figure 5:
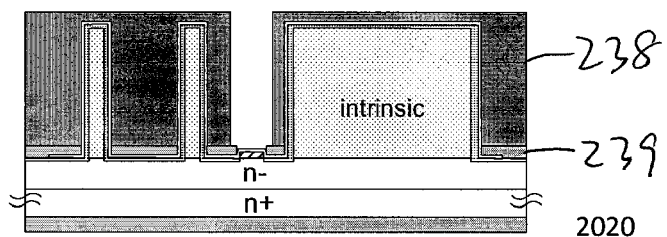
Figure 5:
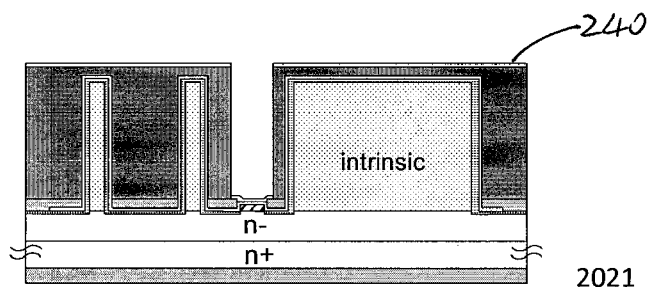
Figure 5:
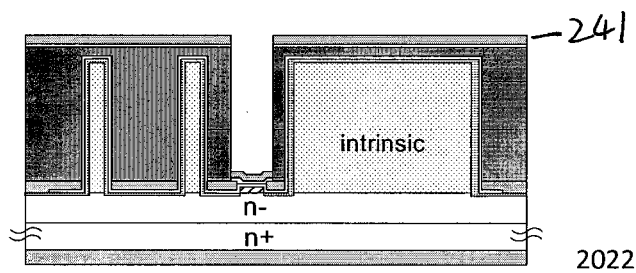
Figure 5:
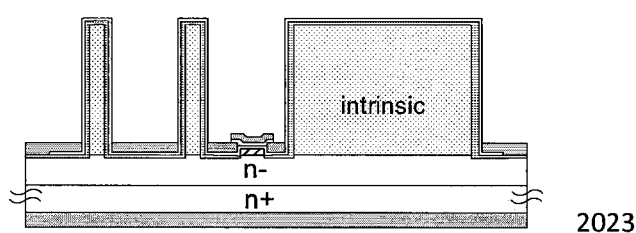

FIG. 5 shows an exemplary method of fabrication of the device 20.

In step 2000, a silicon substrate 210 is provided, wherein the silicon substrate comprises an intrinsic layer or a lightly doped n type silicon epitaxial layer 221, a heavily doped n type layer 223 and a lightly doped n type layer 222 sandwiched between the layers 221 and 223. A substrate of semiconductor material other than silicon (e.g. III-V or II-VI group compound semiconductor) can also be used.

In step 2001, a resist layer 225 (e.g. a photoresist or an e-beam resist) is deposited on the layer 221, by a suitable method such as spin coating.

In step 2002, a pattern is formed in the resist layer 225 using a lithography technique (e.g. photolithrograph or e-beam lithography) by removing portions 226 of the resist layer 225. The layer 221 is exposed under the removed portions 226. The pattern corresponds to shapes and positions of the features 200.

In step 2003, a metal layer 227 is deposited on the resist layer 225 and the exposed portions of the layer 221, using a suitable technique such as thermal evaporation, e-beam evaporation, and sputtering. Exemplary metal suitable for use in the metal layer 227 are aluminum, gold, chromium, silver, copper, titanium, nickel or a combination thereof.

In step 2004, remainder of the resist layer 225 and portions of the metal layer 227 thereon are lift-off by a suitable technique such as plasma ashing and dissolution in a suitable solvent.

In step 2005, features 200 are formed by etching into the substrate 210 using a suitable technique, such as dry etching with remainder of the metal layer 227 as etch mask, until portions of the lightly doped n type layer 222 not directly below the remainder of the metal layer 227 are exposed. The features 200 now comprise remainder of the layer 221.

In step 2006, remainder of the metal layer 227 is removed by a suitable technique such as wet etching with a suitable metal etchant.

In step 2007, a resist layer 229 (e.g. a photoresist or an e-beam resist) is deposited on the layer 222 and the features 200, by a suitable method such as spin coating. The resist layer 229 is then patterned using a lithography technique to expose portions of the layer 222 at boundaries of the subpixels.

In step 2008, a silicon nitride or aluminum oxide layer 230 is deposited anisotropically over the exposed portions of the layer 222 and on the resist layer 229 using a suitable technique such as thermal evaporation, e-beam evaporation, and sputtering.

In step 2009, remainder of the resist layer 229 and any portions of the layer 230 thereon are removed by plasma ashing or dissolution in a suitable solvent.

In step 2010, a p-type dopant layer 231 is deposited isotropically over the features 200, remainder of on the layer 230, and the layer 222, using a suitable technique such as ALD or CVD. ALD is preferred. The p-type dopant layer 231 can comprise a suitable p-type dopant such as trimethyboron, triiospropylborane, triethoxyborane, triisopropoxyborane, and a combination thereof.

In step 2011, an oxide layer 232 is deposited isotropically over the p-type dopant layer 231 using a suitable technique such as ALD or CVD.

In step 2012, a heavily doped p type layer 233 is formed by annealing the device 20 to diffuse the p-type dopant layer 231 into the layer 222. The annealing can be done in a suitable atmosphere (e.g. argon) at about 850° C. for 10 to 30 minutes.

In step 2013, the oxide layer 232 is removed by a suitable method such as etching with buffered HF followed by washing. Now the heavily doped p type layer 233 is exposed.

In step 2014, a layer of oxide 234 (e.g. $HfO_2$, $SiO_2$, $Al_2O_3$) is deposited isotropically over the layer 233 and remainder of on the layer 230, using suitable technique such as atomic layer deposition (ALD) and chemical vapor deposition (CVD). The layer of oxide 234 is functional to passivate surfaces of the layer 233.

In step 2015, a resist layer 235 (e.g. a photoresist or an e-beam resist) is deposited on the layer 234, by a suitable method such as spin coating. The resist layer 235 is then patterned using a lithography technique to expose portions of the layer 234.

In step 2016, exposed portions of the layer 234 is removed by a suitable technique such as dry etching to expose portions of the layer 233. The resist layer 235 is then removed by ashing or dissolution in a suitable solvent.

In step 2017, a resist layer 237 (e.g. a photoresist or an e-beam resist) is deposited on the layers 233 and 234, by a suitable method such as spin coating. The resist layer 237 is then patterned using a lithography technique such that only the features 200 and the layer 230 remain under the resist layer 237.

In step 2018, a metal layer 239 is deposited anisotropically on and between the features 200 such that sidewalls of the features 200 are preferably free of the metal layer 239. The metal layer 239 can be deposited by thermal evaporation or e-beam evaporation. Exemplary metal suitable for use in the metal layer 239 are aluminum, gold, chromium, silver, copper, titanium, nickel or a combination thereof. The resist layer 237 is then removed by plasma ashing or dissolution in a suitable solvent.

In step 2019, the device 20 is annealed under a suitable atmosphere (e.g. $H_2$ and $N_2$) at about 450° C. for about 30 minutes, such that the metal layer 239 and the exposed portions of the heavily doped p type layer 233 form an Ohmic contact.

In step 2020, a resist layer 238 (e.g. a photoresist or an e-beam resist) is deposited on the layers 239 and 234, by a suitable method such as spin coating. The resist layer 238 is then patterned using a lithography technique to expose the remainder of the layer 230 and any portion of the layer 234 thereon.

In step 2021, an oxide layer 240 is deposited anisotropically over any portion of the layer 234 on the remainder of the layer 230, and over the resist layer 238, using a suitable technique such as thermal evaporation or e-beam evaporation. The oxide layer 240 is an electrical insulator.

In step 2022, a metal layer 241 is deposited anisotropically over the oxide layer 240, using a suitable technique such as thermal evaporation or e-beam evaporation. The metal layer 241 is optically opaque.

In step 2023, the resist layer 238 and any portions of the oxide layer 240 and the metal layer 241 thereon are removed by a suitable technique such as plasma ashing and dissolution in a suitable solvent.

Figure 6:
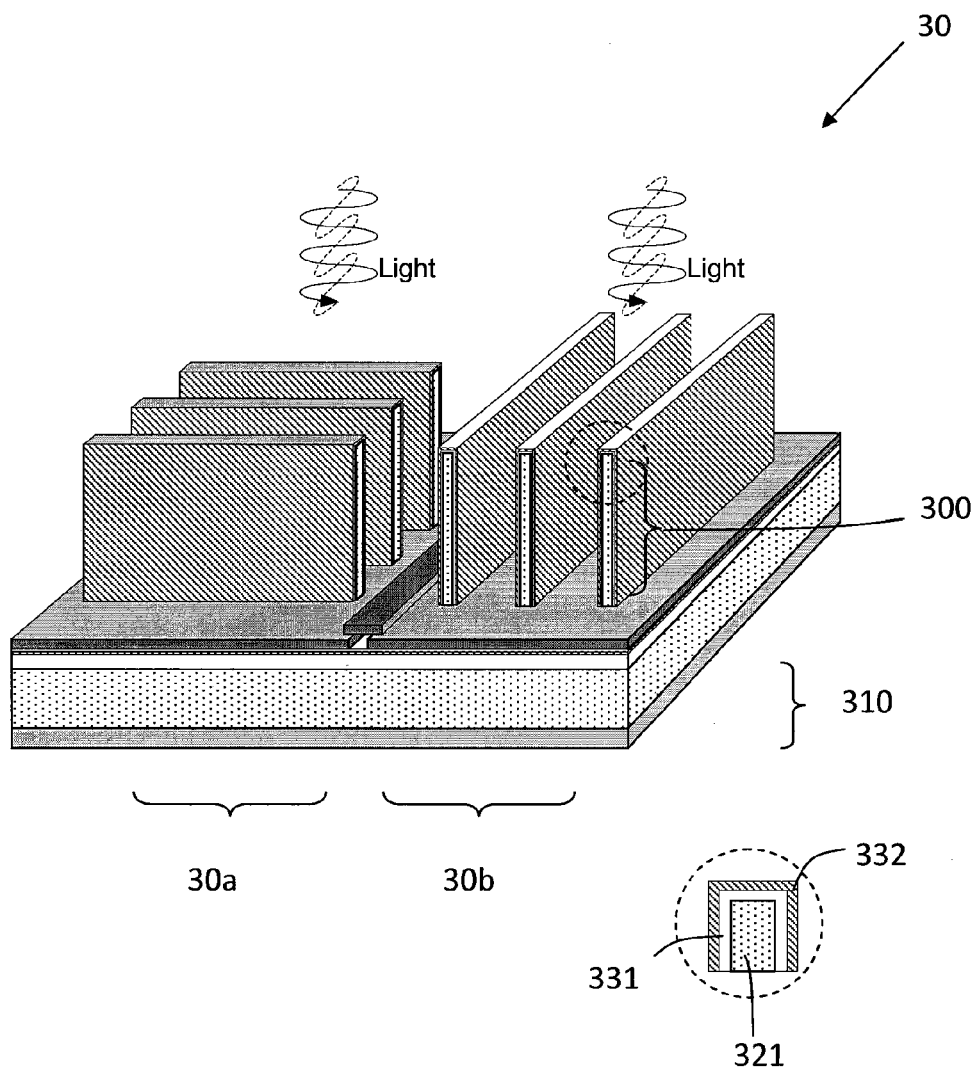
FIG. 6 is a perspective view of the device according one embodiment.

FIG. 6 shows a device 30 according to one embodiment. For brevity, two subpixels 30a and 30b of a substrate 310 are illustrated. The device 30, however, can comprise a plurality of pixels such as more than 100, more than 1000, more than 1000000. The subpixels preferably have a pitch of about 1 micron to 100 microns (more preferably 5 microns). In each of the subpixels 30a and 30b, the device 30 comprises a plurality of features 300 (e.g. at least 2 features), respectively. The features 300 in the subpixel 30a and the features 300 in the subpixel 30b extend in different transverse directions. The features 300 preferably have a pitch (i.e. spacing between adjacent features 100 in the thickness direction thereof) of about 0.5 to 5 microns (further preferably about 1 micron), a height (i.e. dimension in the normal direction) of about 0.3 to 10 microns (further preferably about 5 micron) and an aspect ratio (i.e. ratio of a dimension in the transverse direction to a dimension in the thickness direction) of at least 4:1, preferably at least 10:1. Each of the features 300 preferably comprises a p-i-n diode, the p-i-n diode being functional to convert at least a portion of light impinged thereon to an electrical signal. Each feature 300 comprises a core 321 of lightly doped semiconductor, an intermediate shell 331 of intrinsic semiconductor and an outer shell 332 of doped semiconductor. The intermediate shell 331 is conformally disposed over the core 321. The outer shell 332 is conformally disposed over the intermediate shell 331. The outer shell 332 is of an opposite type from the core 321. The outer shell 332, the intermediate shell 331 and the core 321 form the p-i-n diode. Space between the features 300 can be filled with a transparent material. The device 20 preferably further comprises electrical components configured to detect the electrical signal from the features 300, for example, an electrode disposed between and electrically connected to the features 300 on each subpixel. The electrode disposed between the features 300 on each subpixel preferably is separate from the electrode disposed between the features 300 on adjacent subpixels. The electrode can also function as a reflective layer. The substrate 310 can have a thickness in the normal direction of about 5 to 700 microns (preferably 120 microns).

Figure 7:
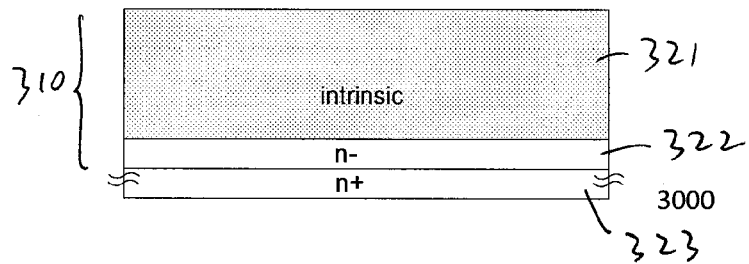
FIG. 7 shows a method of fabricating the device of FIG. 6.
Figure 7:
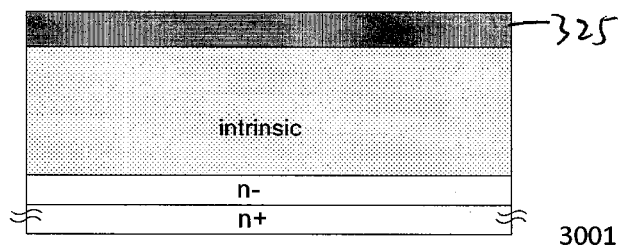
Figure 7:
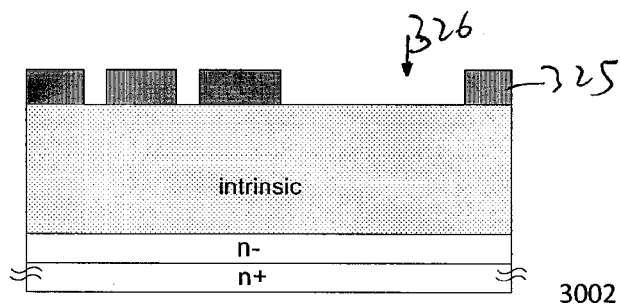
Figure 7:
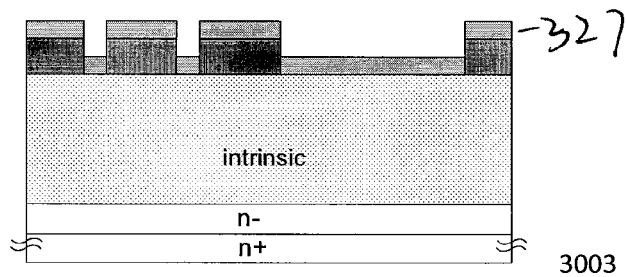
Figure 7:
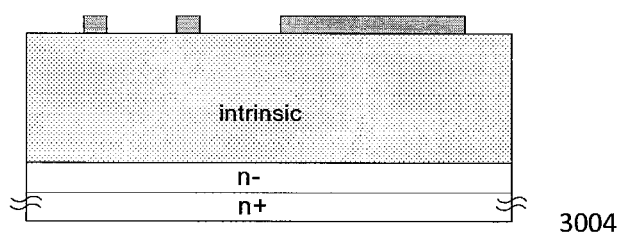
Figure 7:
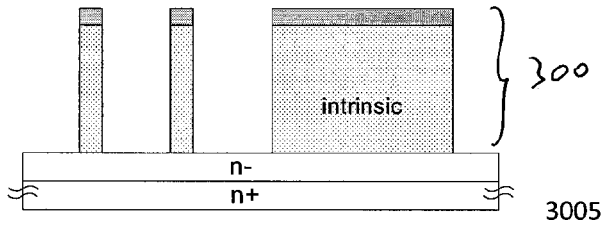
Figure 7:
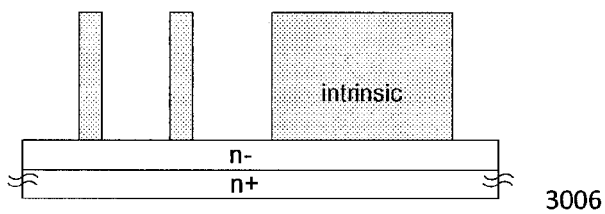
Figure 7:
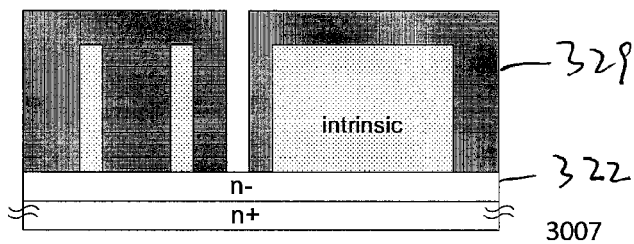
Figure 7:
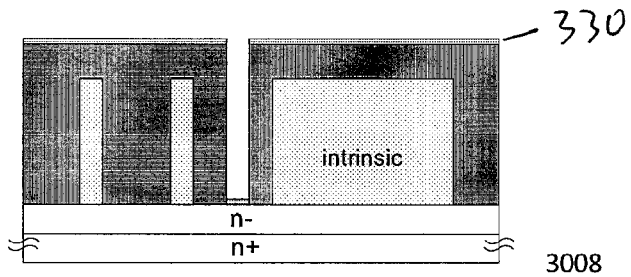
Figure 7:
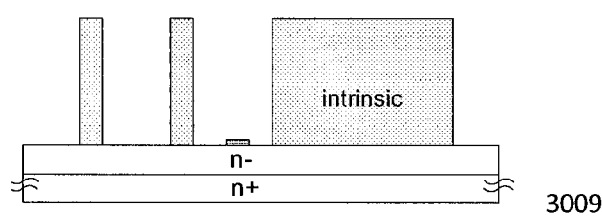
Figure 7:
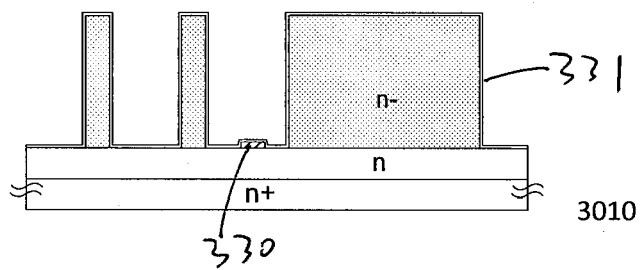
Figure 7:
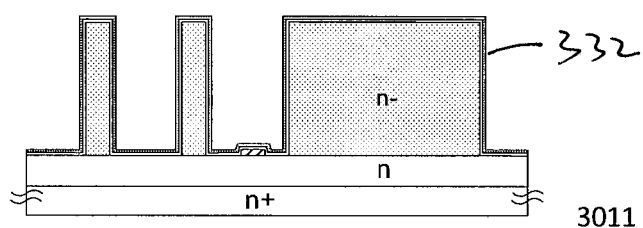
Figure 7:
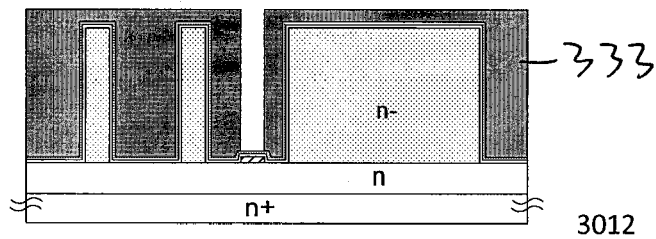
Figure 7:
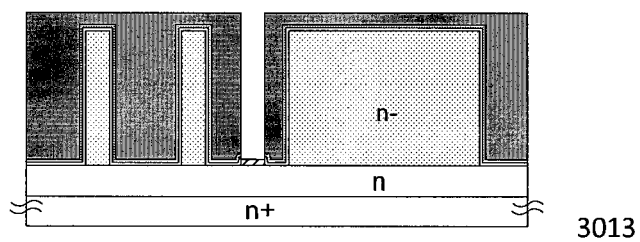
Figure 7:
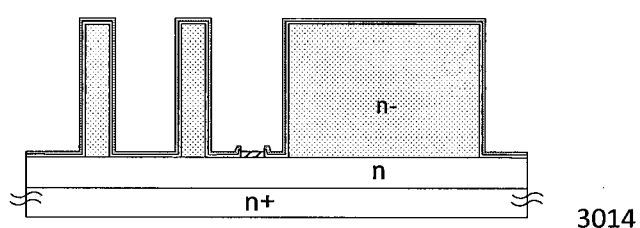
Figure 7:
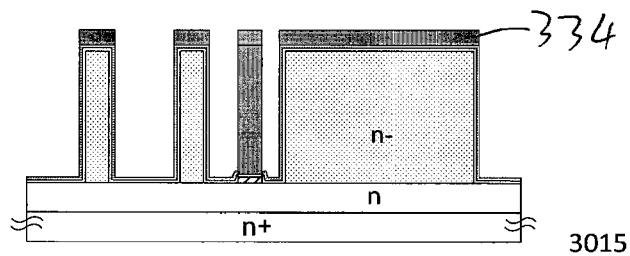
Figure 7:
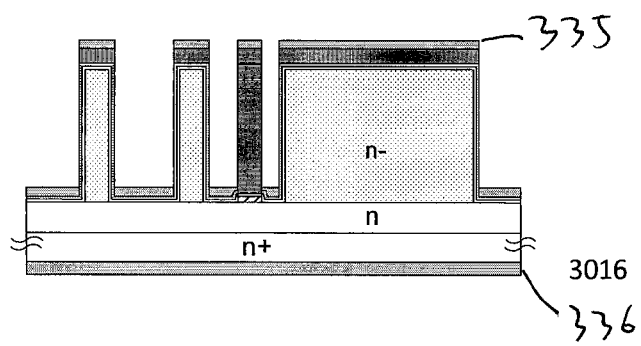
Figure 7:
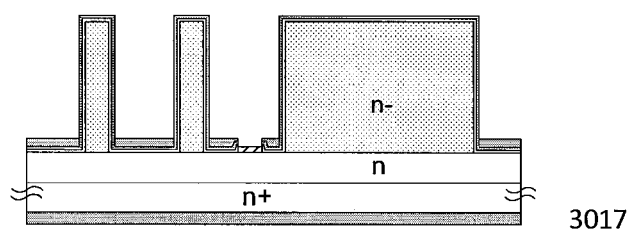
Figure 7:
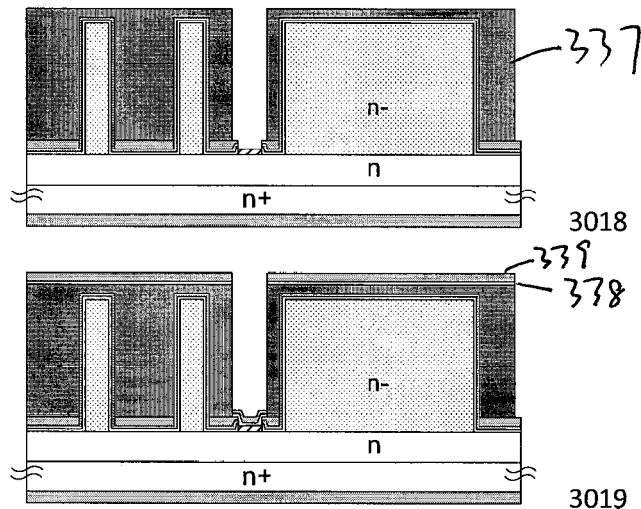
Figure 7:
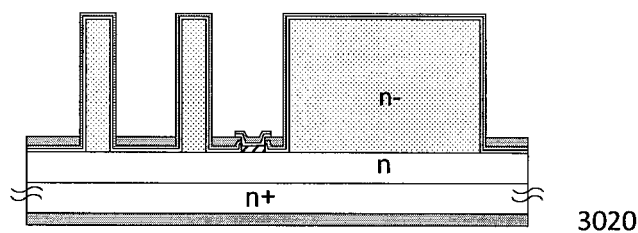

FIG. 7 shows an exemplary method of fabrication of the device 30.

In step 3000, a silicon substrate 310 is provided, wherein the silicon substrate comprises a lightly doped n type silicon epitaxial layer 321, a heavily doped n type layer 323 and a n type layer 322 sandwiched between the layers 321 and 323. A substrate of semiconductor material other than silicon (e.g. III-V or II-VI group compound semiconductor) can also be used.

In step 3001, a resist layer 325 (e.g. a photoresist or an e-beam resist) is deposited on the layer 321, by a suitable method such as spin coating.

In step 3002, a pattern is formed in the resist layer 325 using a lithography technique (e.g. photolithrograph or e-beam lithography) by removing portions 326 of the resist layer 325. The layer 321 is exposed under the removed portions 326. The pattern corresponds to shapes and positions of the features 300.

In step 3003, a metal layer 327 is deposited on the resist layer 325 and the exposed portions of the layer 321, using a suitable technique such as thermal evaporation, e-beam evaporation, and sputtering. Exemplary metal suitable for use in the metal layer 327 are aluminum, gold, chromium, silver, copper, titanium, nickel or a combination thereof.

In step 3004, remainder of the resist layer 325 and portions of the metal layer 327 thereon are lift-off by a suitable technique such as plasma ashing and dissolution in a suitable solvent.

In step 3005, features 300 are formed by etching into the substrate 310 using a suitable technique, such as dry etching with remainder of the metal layer 327 as etch mask, until portions of the lightly doped n type layer 322 not directly below the remainder of the metal layer 327 are exposed. The features 300 now comprise remainder of the layer 321.

In step 3006, remainder of the metal layer 327 is removed by a suitable technique such as wet etching with a suitable metal etchant.

In step 3007, a resist layer 329 (e.g. a photoresist or an e-beam resist) is deposited on the layer 322 and the features 300, by a suitable method such as spin coating. The resist layer 329 is then patterned using a lithography technique to expose portions of the layer 322 at boundaries of the subpixels.

In step 3008, a silicon nitride or aluminum oxide layer 330 is deposited anisotropically over the exposed portions of the layer 322 and on the resist layer 329 using a suitable technique such as thermal evaporation, e-beam evaporation, and sputtering.

In step 3009, remainder of the resist layer 329 and any portions of the layer 330 thereon are removed by plasma ashing or dissolution in a suitable solvent.

In step 3010, an intrinsic amorphous silicon (a-Si) layer 331 is deposited isotropically over the features 300, remainder of on the layer 330, and the layer 322, using a suitable technique such as ALD or CVD. ALD is preferred.

In step 3011, a p type doped a-Si layer 332 is deposited isotropically over the layer 331 using a suitable technique such as ALD or CVD. The device 30 is then annealed in a suitable atmosphere (e.g. forming gas) at about 450° C. for about 30 minutes.

In step 3012, a resist layer 333 (e.g. a photoresist or an e-beam resist) is deposited on the layer 332, by a suitable method such as spin coating. The resist layer 333 is then patterned using a lithography technique to expose any portion of the layer 332 on the remainder of the layer 330.

In step 3013, exposed portions of the layer 332 and any portion of the layer 331 thereunder are removed by a suitable method such as dry etch, until the layer 330 is exposed.

In step 3014, the resist layer 333 is removed by plasma ashing or dissolution in a suitable solvent.

In step 3015, a resist layer 334 (e.g. a photoresist or an e-beam resist) is deposited by a suitable method such as spin coating. The resist layer 334 is then patterned using a lithography technique such that only the features 300 and the layer 330 remain under the resist layer 334.

In step 3016, a metal layer 335 is deposited anisotropically on and between the features 300 such that sidewalls of the features 300 are preferably free of the metal layer 335. A metal layer 336 is deposited on the layer 323. The metal layers 335 and 336 can be deposited by thermal evaporation or e-beam evaporation. Exemplary metal suitable for use in the metal layer 335 are aluminum, gold, chromium, silver, copper, titanium, nickel or a combination thereof.

In step 3017, the resist layer 334 and any portion of the metal layer 335 thereon are removed by plasma ashing or dissolution in a suitable solvent. The device 30 is then annealed under a suitable atmosphere (e.g. $H_2$ and $N_2$) at about 450° C. for about 30 minutes, such that the metal layers 335 and 336 form Ohmic contacts with the layer 332 and 323, respectively.

In step 3018, a resist layer 337 (e.g. a photoresist or an e-beam resist) is deposited on the layers 332 and 335, by a suitable method such as spin coating. The resist layer 337 is then patterned using a lithography technique to expose the remainder of the layer 330.

In step 3019, an oxide layer 338 and a metal layer 339 are sequentially deposited anisotropically, using a suitable technique such as thermal evaporation or e-beam evaporation. The oxide layer 338 is an electrical insulator. The metal layer 241 is optically opaque.

In step 3020, the resist layer 337 and any portions of the oxide layer 338 and the metal layer 339 thereon are removed by a suitable technique such as plasma ashing and dissolution in a suitable solvent.

Figure 8:
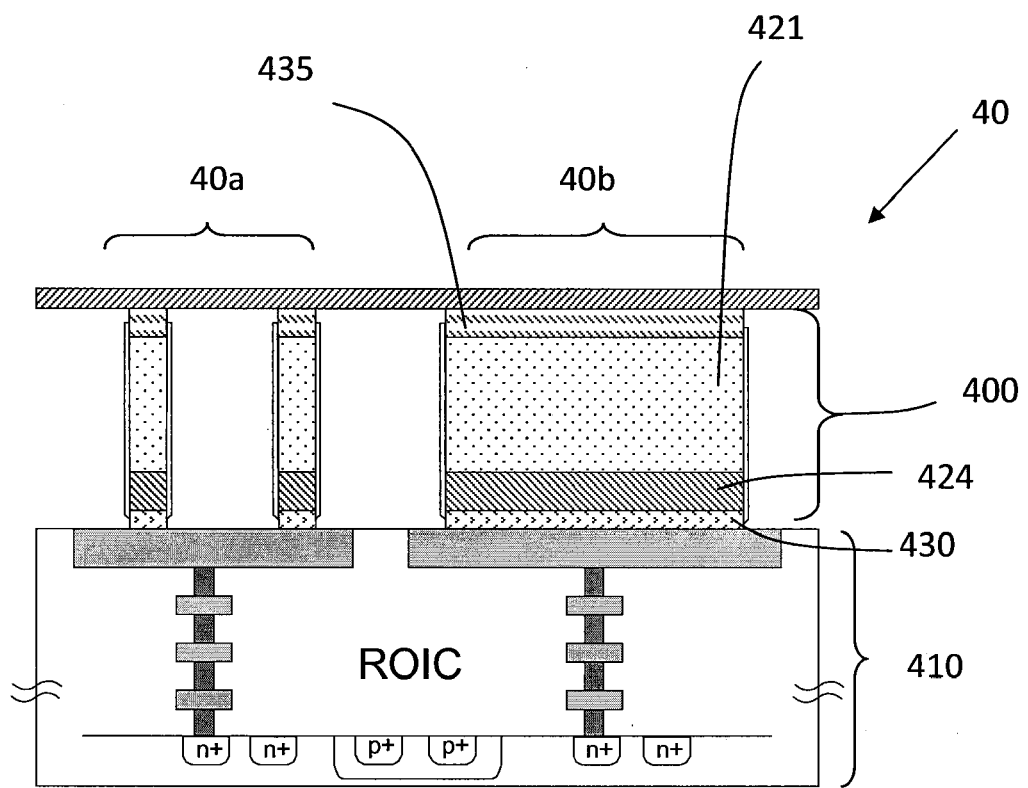
FIG. 8 is a perspective view of the device according one embodiment.

FIG. 8 shows a device 40 according to one embodiment. For brevity, two subpixels 40a and 40b of a substrate 410 are illustrated. The device 40, however, can comprise a plurality of pixels such as more than 100, more than 1000, more than 1000000. The subpixels preferably have a pitch of about 1 micron to 100 microns (more preferably 5 microns). In each of the subpixels 40a and 40b, the device 40 comprises a plurality of features 400 (e.g. at least 2 features), respectively. The features 400 in the subpixel 40a and the features 400 in the subpixel 40b extend in different transverse directions. The features 400 preferably have a pitch (i.e. spacing between adjacent features 100 in the thickness direction thereof) of about 0.5 to 5 microns (further preferably about 1 micron), a height (i.e. dimension in the normal direction) of about 0.3 to 10 microns (further preferably about 5 micron) and an aspect ratio (i.e. ratio of a dimension in the transverse direction to a dimension in the thickness direction) of at least 4:1, preferably at least 10:1. Each of the features 400 preferably comprises a p-i-n diode therein, the p-i-n diode being functional to convert at least a portion of light impinged thereon to an electrical signal, wherein the p-i-n diode is formed along the normal direction. For example, each feature 400 comprises a first heavily doped semiconductor layer 435, a lightly doped semiconductor layer or intrinsic semiconductor layer 421, a second heavily doped layer 424. The first heavily doped semiconductor layer 435 is disposed on the lightly doped semiconductor layer or intrinsic semiconductor layer 421. The lightly doped semiconductor layer or intrinsic semiconductor layer 421 is disposed on the second heavily doped layer 424. The first heavily doped layer 435 is of an opposite type from the second heavily doped layer 424. The first heavily doped layer 435, the lightly doped semiconductor layer or intrinsic semiconductor layer 421 and the second heavily doped layer 424 form the p-i-n diode. Space between the features 300 can be filled with a transparent material. The features 400 preferably are bonded to the substrate 410. The device 40 preferably further comprises electrical components configured to detect the electrical signal from the features 400, for example, Read-out Integrated Circuits (ROIC) in the substrate 410. The ROIC can be electrically connected to the second heavily doped layer 424. The substrate 410 can have a thickness in the normal direction of about 5 to 700 microns (preferably 120 microns).

Figure 9:
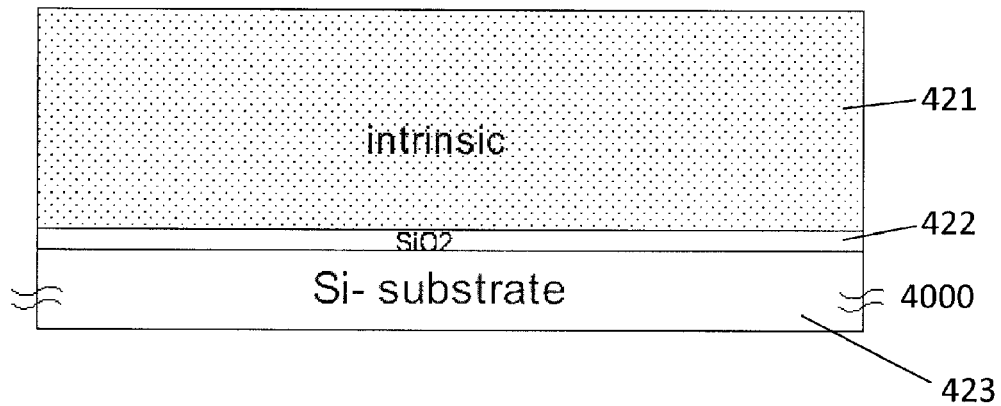
FIG. 9 shows a method of fabricating the device of FIG. 8.
Figure 9:
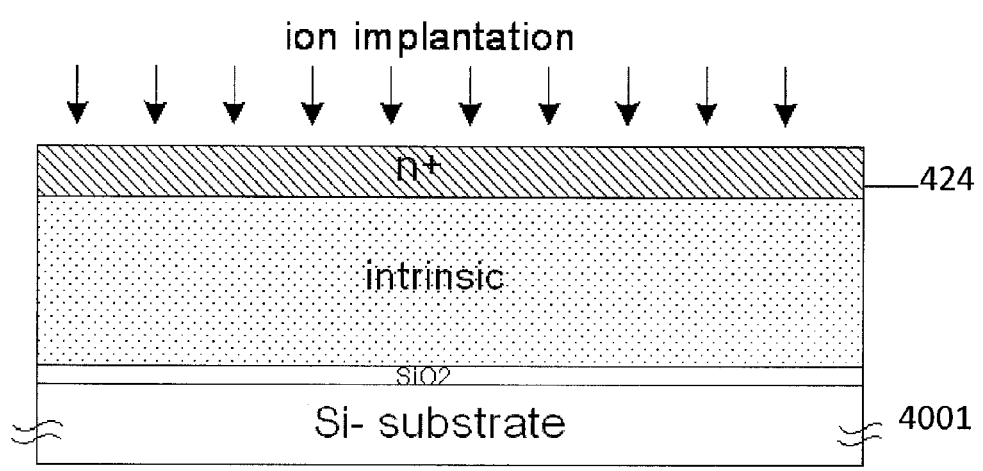
Figure 9:
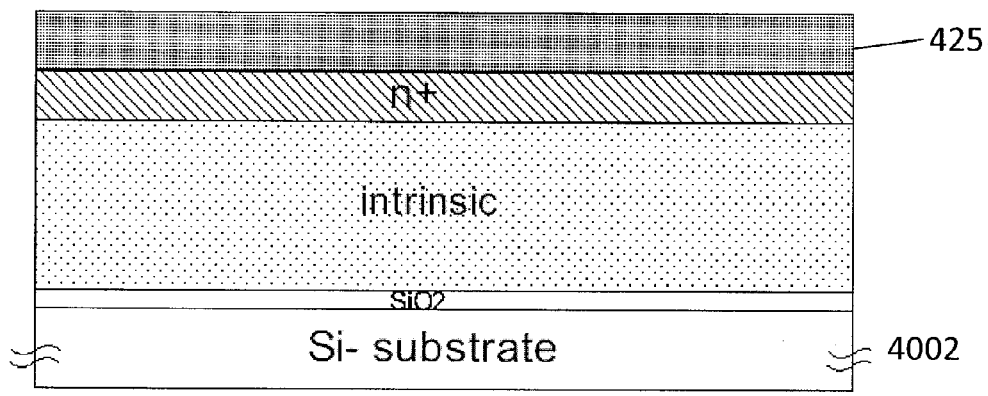
Figure 9:
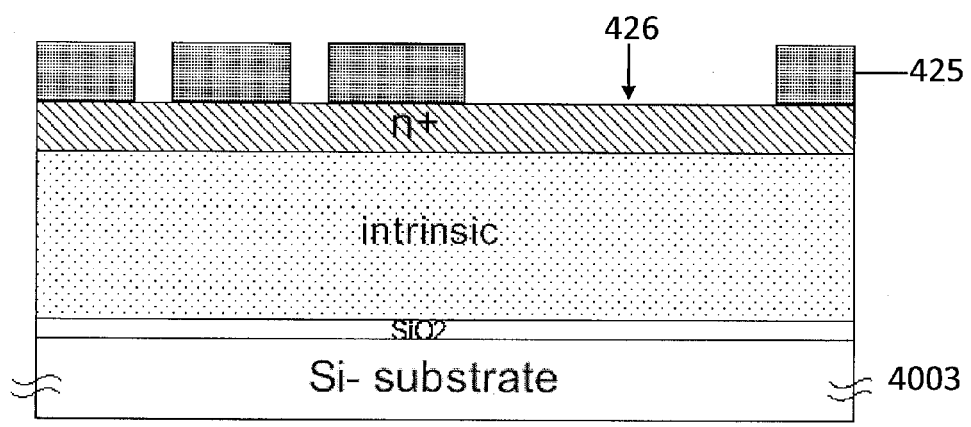
Figure 9:
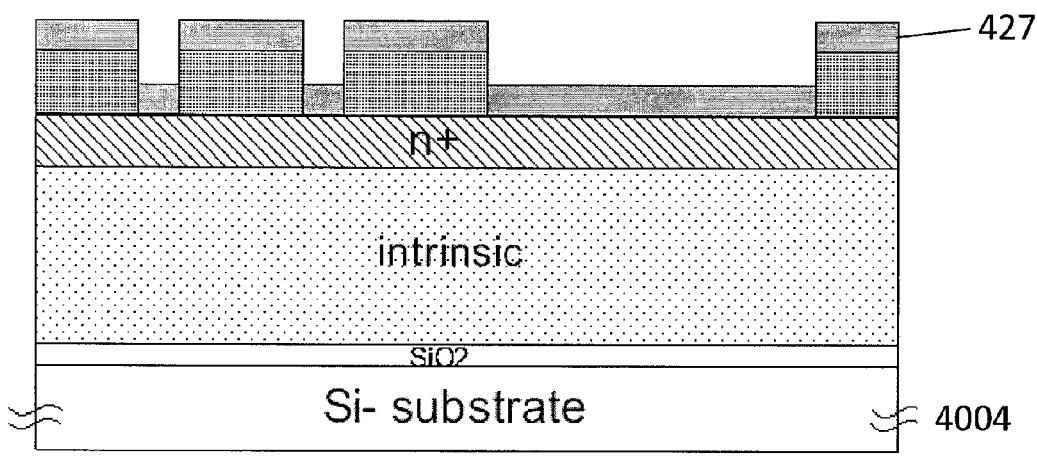
Figure 9:
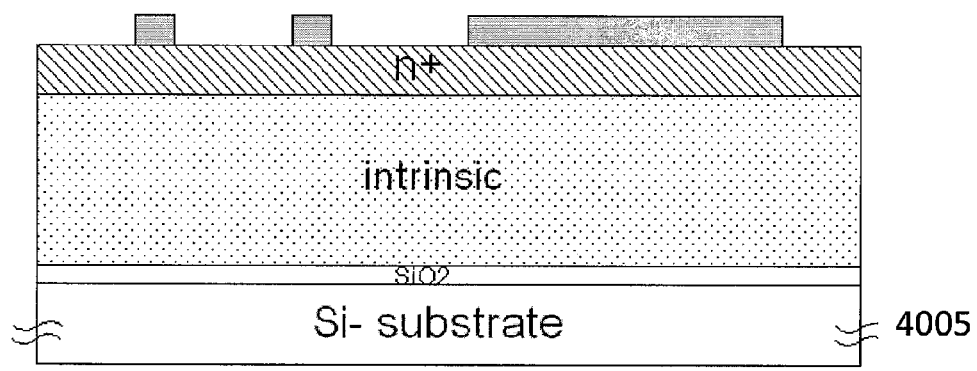
Figure 9:
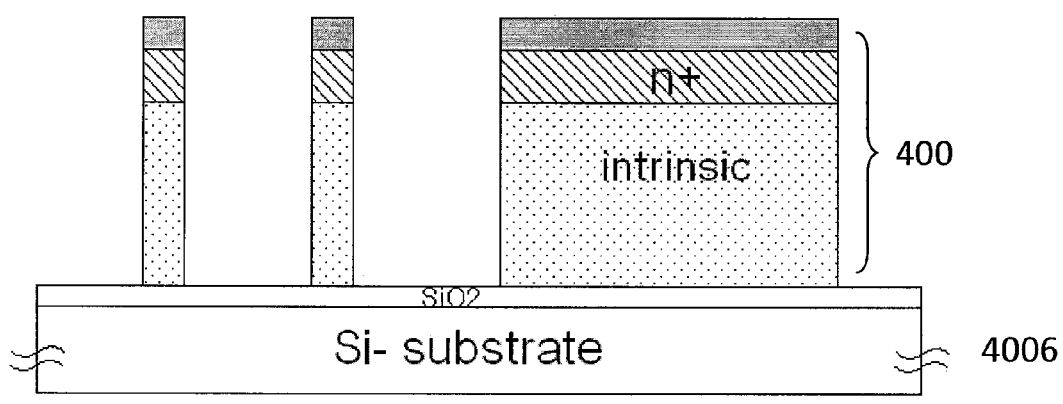
Figure 9:
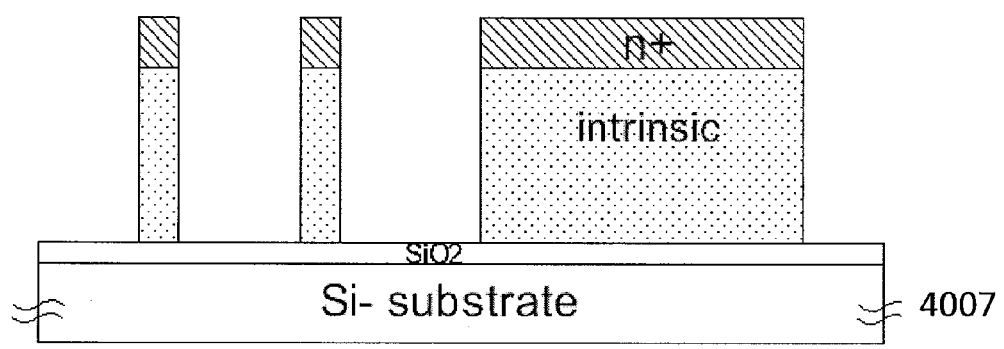
Figure 9:
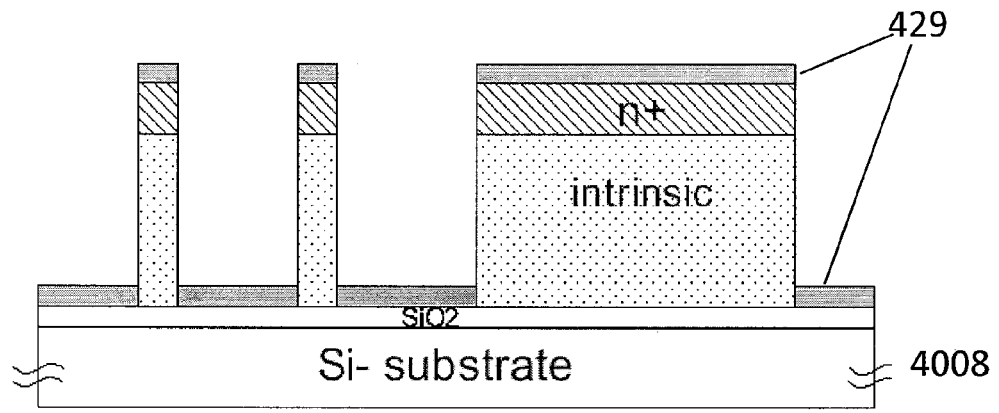
Figure 9:
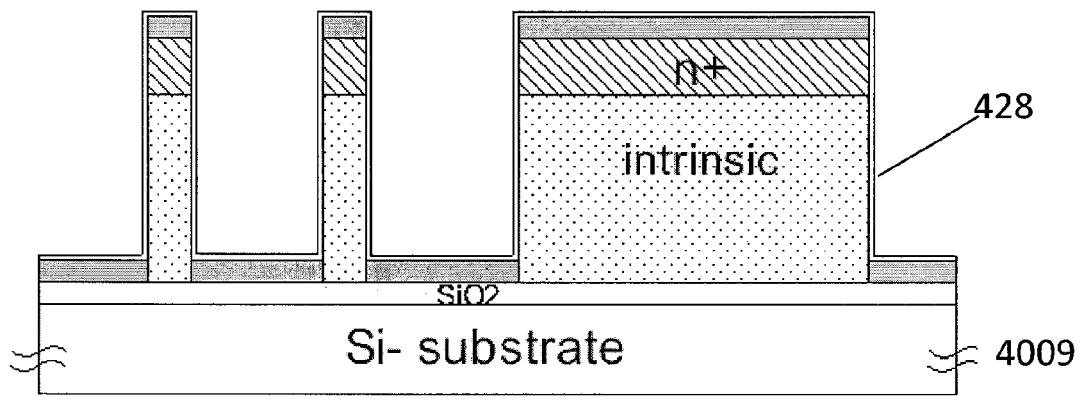
Figure 9:
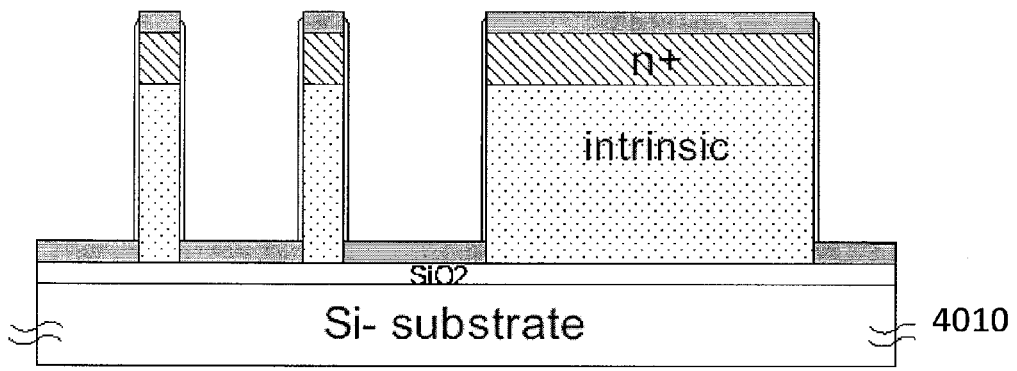
Figure 9:
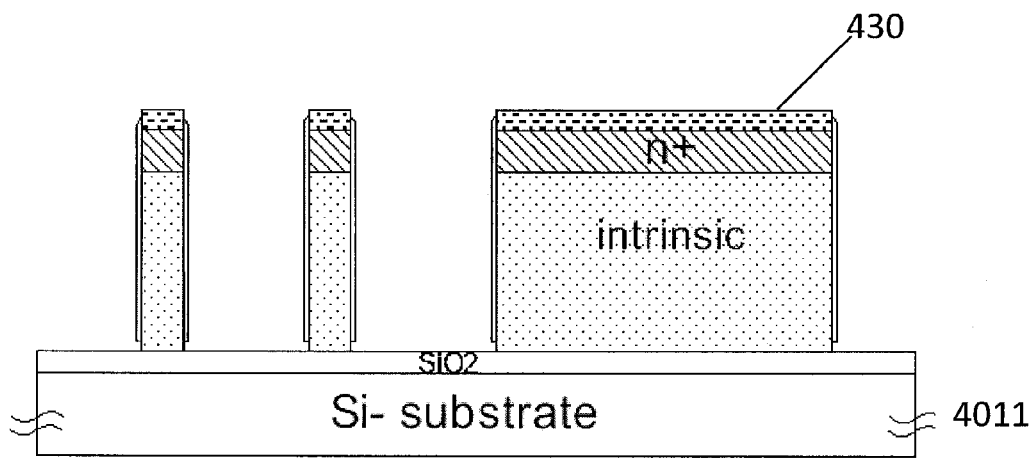
Figure 9:
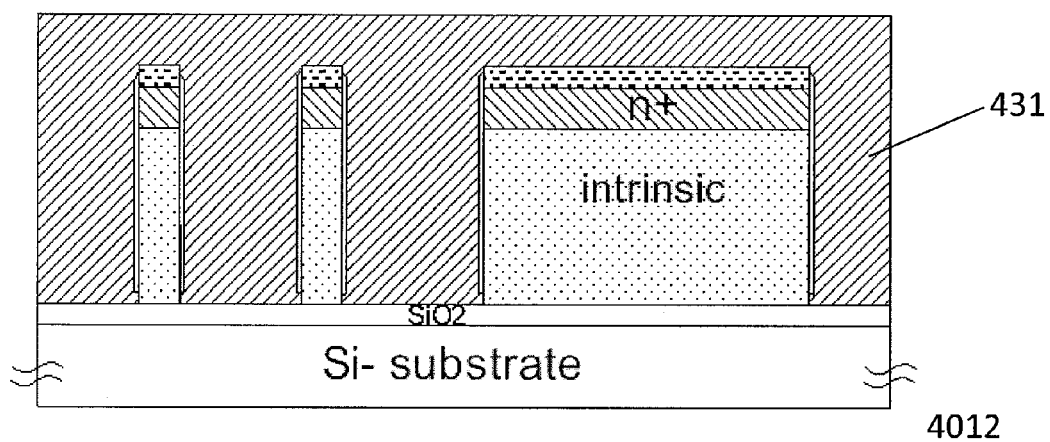
Figure 9:
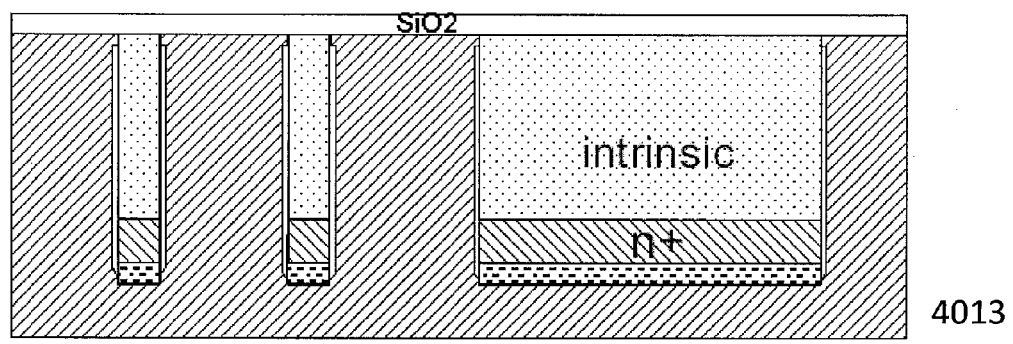
Figure 9:
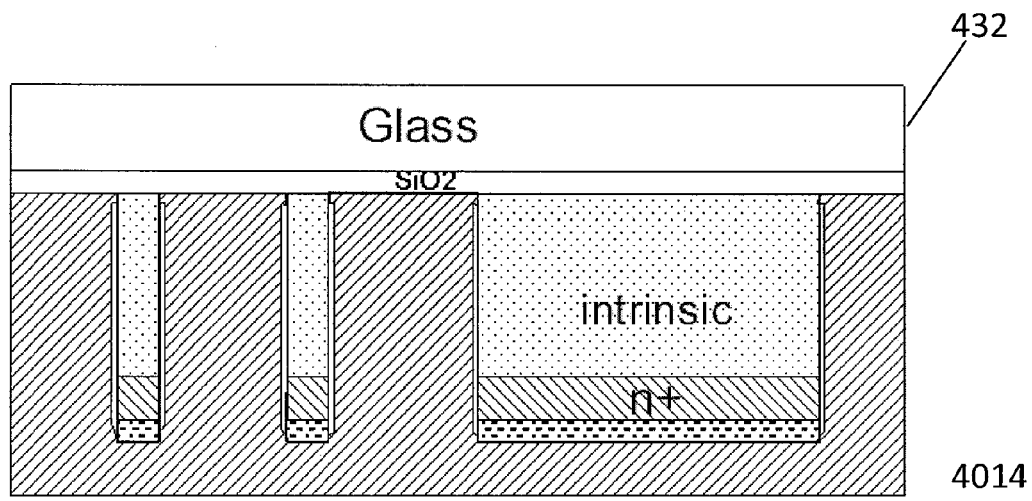
Figure 9:
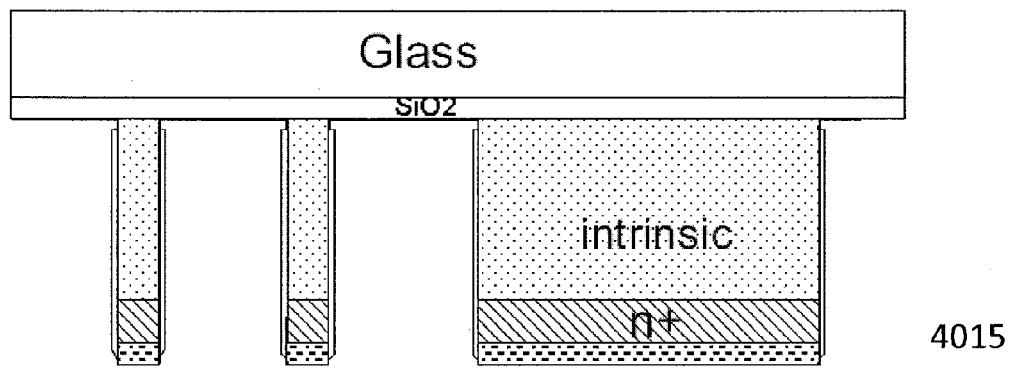
Figure 9:
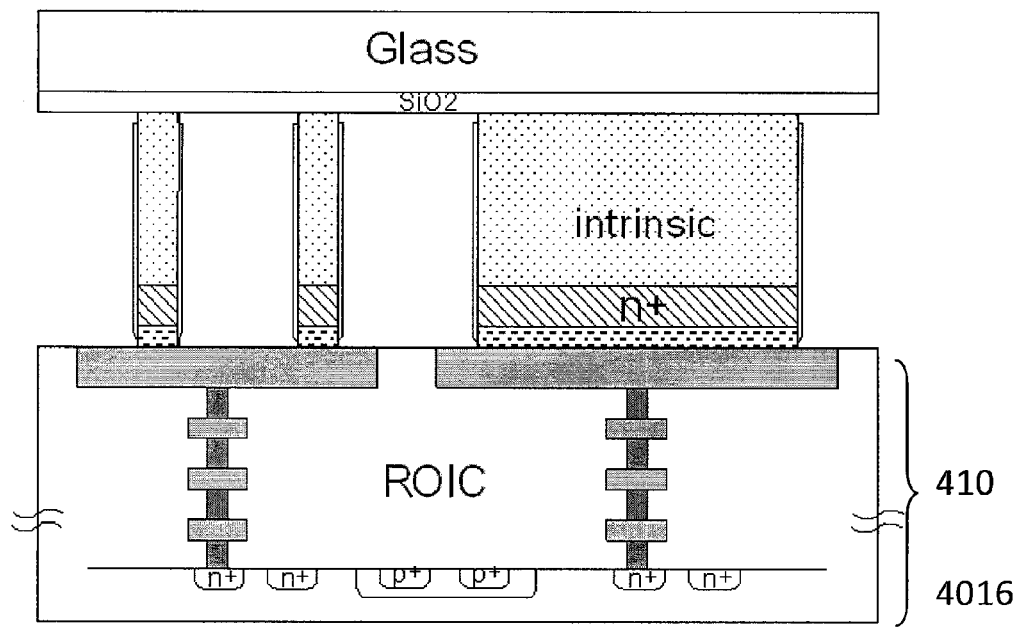
Figure 9:
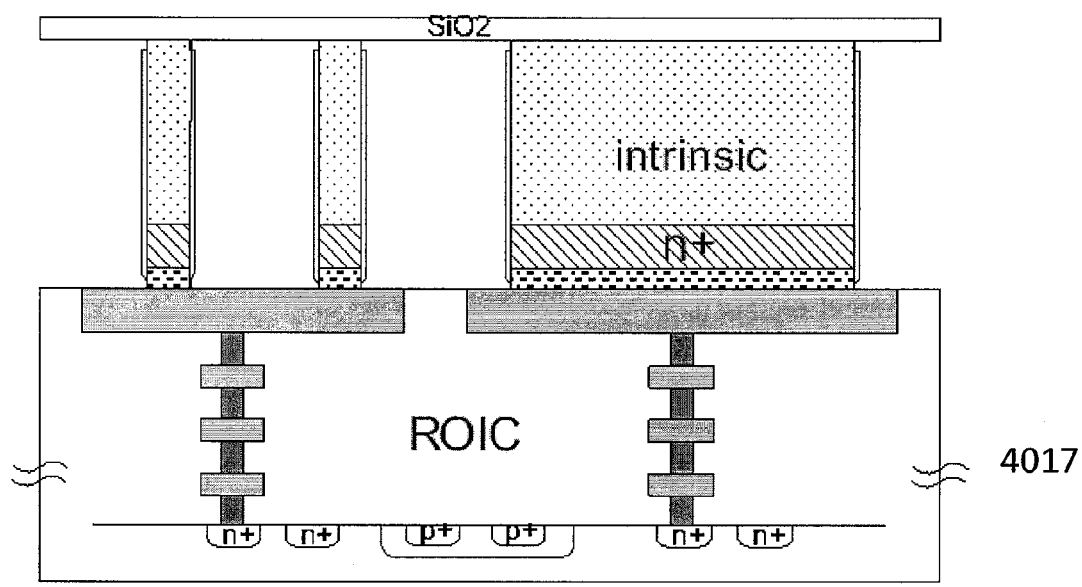
Figure 9:
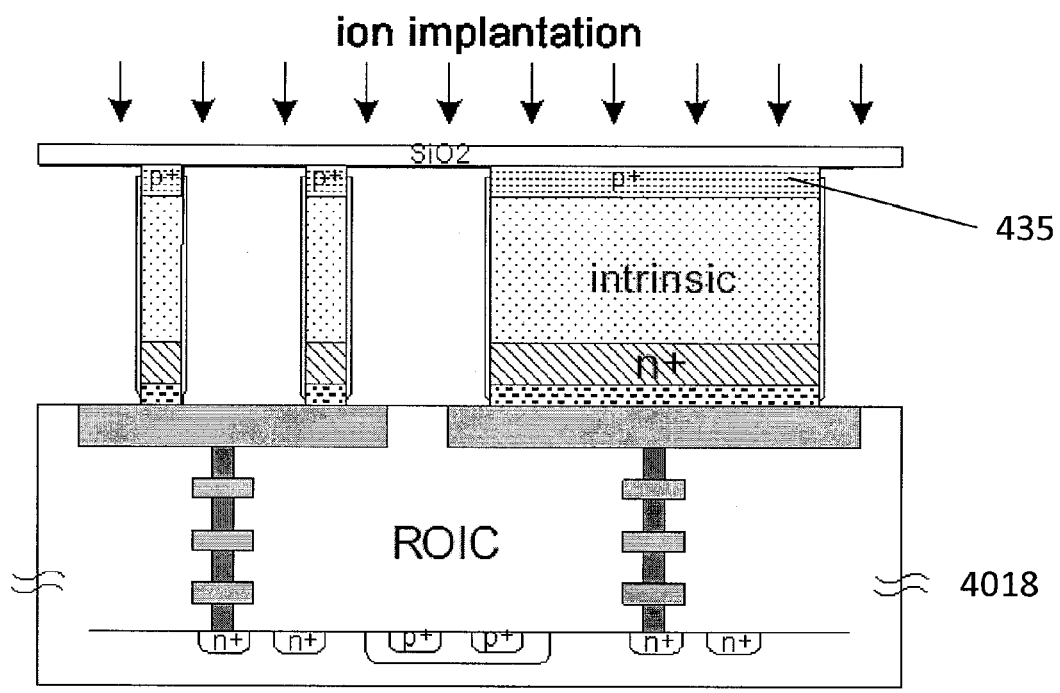
Figure 9:
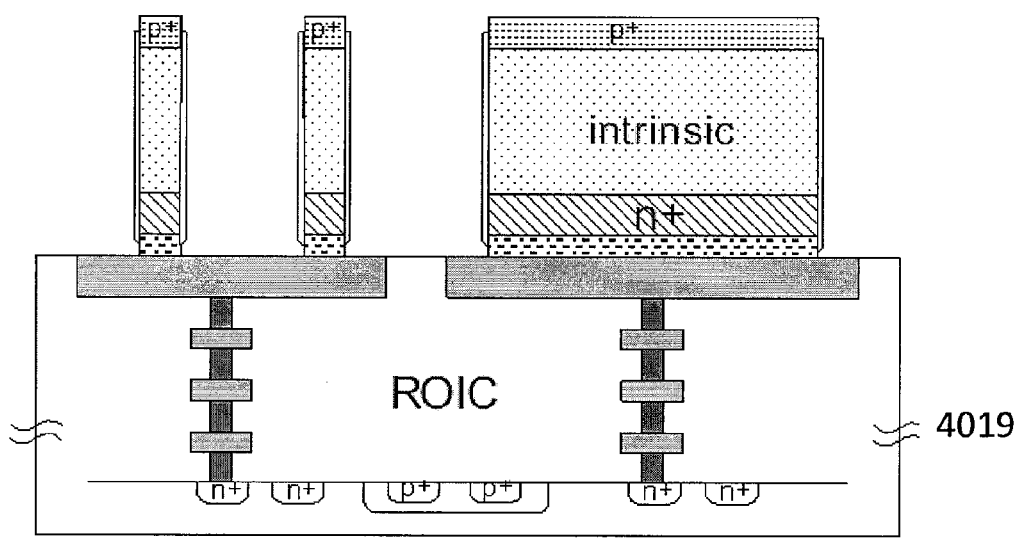
Figure 9:
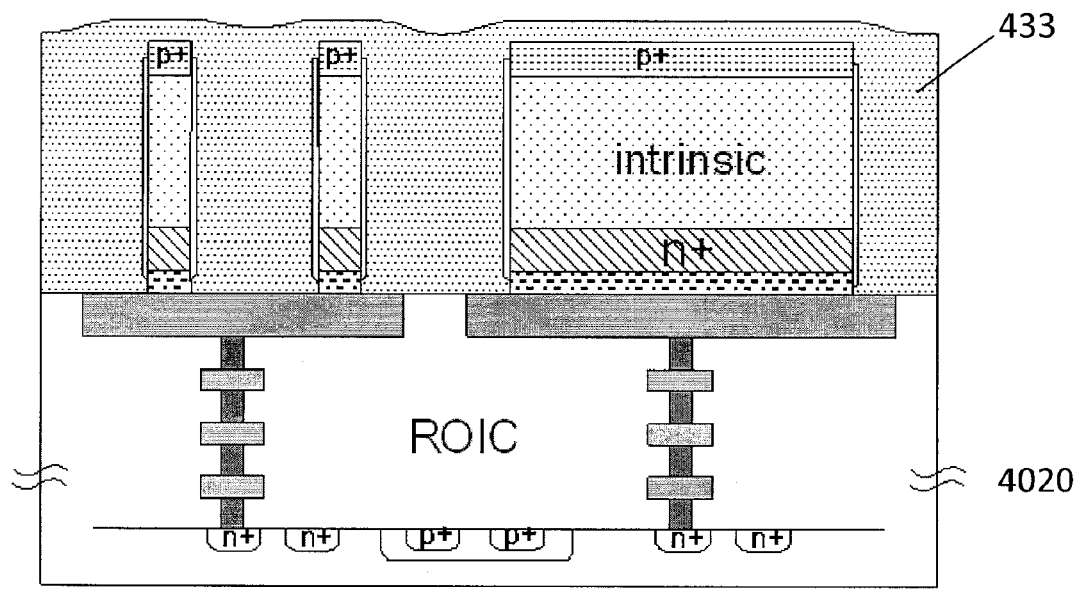
Figure 9:
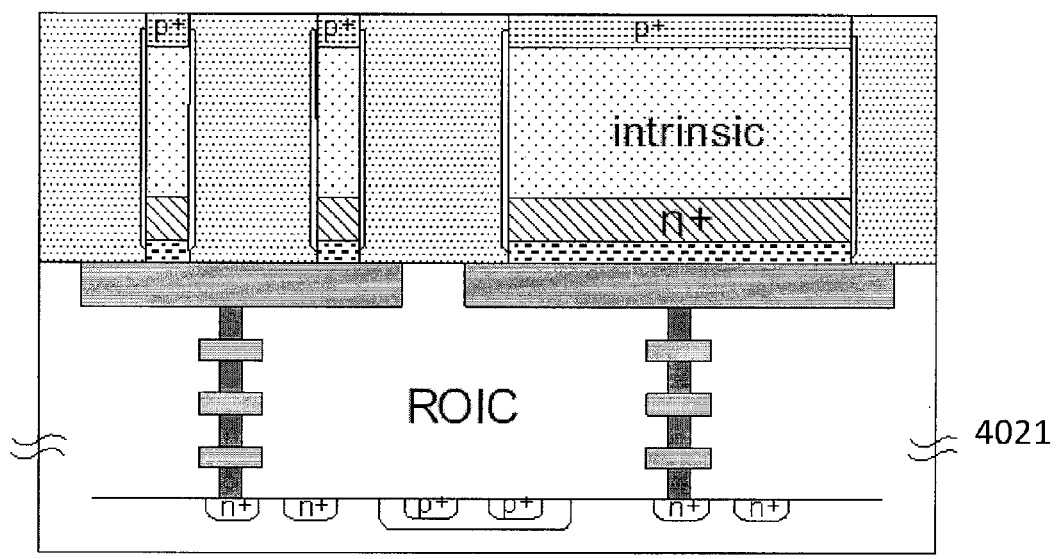
Figure 9:
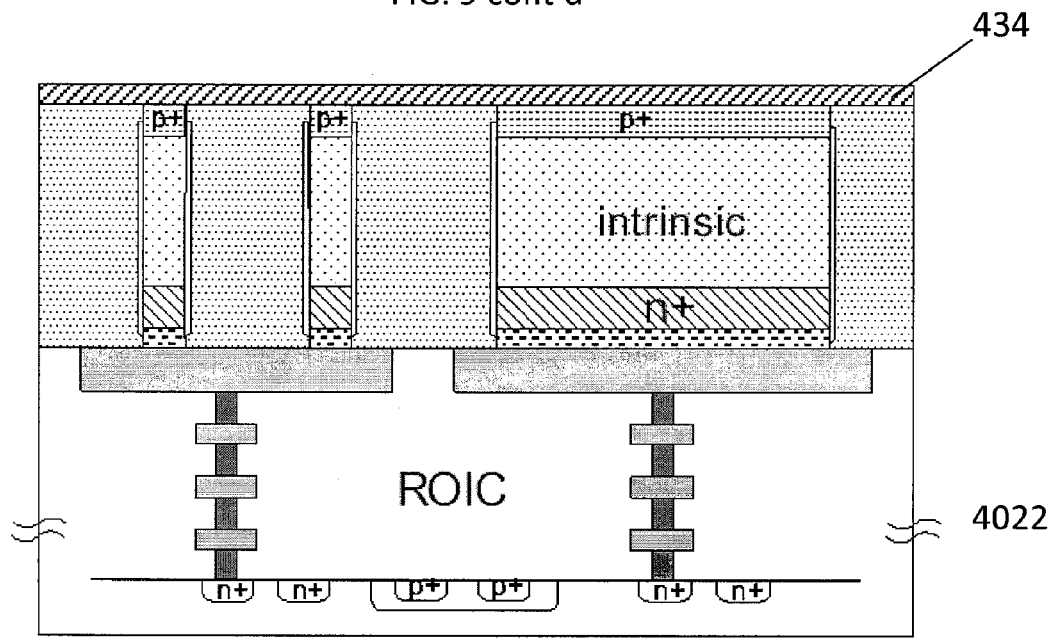
Figure 9:
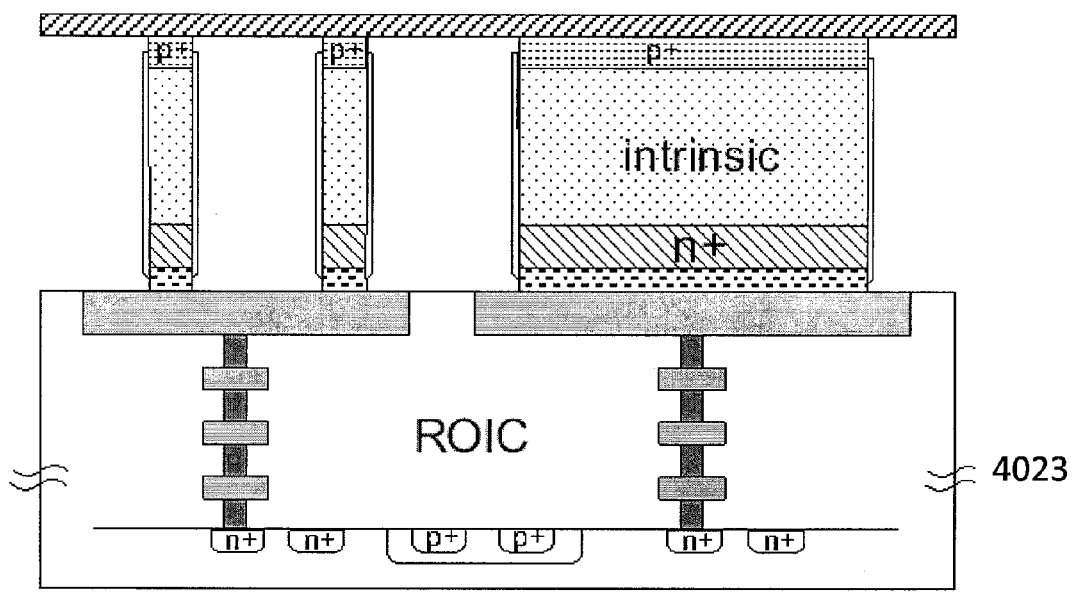

FIG. 9 shows an exemplary method of fabrication of the device 40.

In step 4000, a silicon substrate 423 is provided, wherein the silicon substrate 423 comprises an silicon oxide layer 422 thereon and an intrinsic layer or a lightly doped p type silicon layer 421 on the silicon oxide layer 422. A substrate of semiconductor material other than silicon (e.g. III-V or II-VI group compound semiconductor) can also be used.

In step 4001, a heavily doped n type layer 424 is fabricated on the layer 421 by a method such as ion implantation and subsequent annealing. An exemplary dopant suitable for use in the ion implantation is phosphorous or arsenic.

In step 4002, a resist layer 425 (e.g. a photoresist or an e-beam resist) is deposited on the heavily doped n type layer 424, by a suitable method such as spin coating.

In step 4003, a pattern is formed in the resist layer 425 using a lithography technique (e.g. photolithrograph or e-beam lithography) by removing portions 426 of the resist layer 425. The heavily doped n type layer 424 is exposed under the removed portions 426. The pattern corresponds to shapes and positions of the features 400.

In step 4004, a metal layer 427 is deposited on the resist layer 425 and the exposed portions of the heavily doped n type layer 424, using a suitable technique such as thermal evaporation, e-beam evaporation, and sputtering. Exemplary metal suitable for use in the metal layer 427 are aluminum, gold, chromium, silver, copper, titanium, nickel or a combination thereof.

In step 4005, remainder of the resist layer 425 and portions of the metal layer 427 thereon are lift-off by a suitable technique such as plasma ashing and dissolution in a suitable solvent.

In step 4006, features 400 are formed by etching into the layer 421 using a suitable technique, such as dry etching with remainder of the metal layer 125 as etch mask, until portions of the silicon oxide layer 422 not directly below the remainder of the metal layer 427 are exposed. The features 400 now comprise remainder of the layers 421 and 424.

In step 4007, remainder of the metal layer 427 is removed by a suitable method such as etching with a suitable metal etchant.

In step 4008, a metal layer 429 is deposited anisotropically on the heavily doped n type layer 424 and exposed portions of the silicon oxide layer 422, using a suitable technique such as thermal evaporation, e-beam evaporation, and sputtering. Exemplary metal suitable for use in the metal layer 429 are aluminum, gold, chromium, silver, copper, titanium, nickel or a combination thereof.

In step 4009, an oxide layer 428 (e.g. $HfO_2$, $SiO_2$, $Al_2O_3$) is deposited isotropically over the features 400 and the metal layer 429, using suitable technique such as atomic layer deposition (ALD) and chemical vapor deposition (CVD). The oxide layer 428 is functional to passivate surfaces of the features 400.

In step 4010, portions of the oxide layer 428 above the metal layer 429 are removed by a suitable technique such as anisotropic dry etch. Now the metal layer 429 is exposed.

In step 4011, a silicide layer 430 is formed from the heavily doped n type layer 424 and portions of the metal layer 429 thereon by annealing the device 40. Remainder of the metal layer 429 is removed by a suitable technique such as etching with a suitable metal etchant.

In step 4012, a sacrificial layer 431 is deposited by pouring, spin coating or evaporation to fill space between the features 400. The sacrificial layer 431 can be a suitable material such as polydimethylsiloxane, polyimide or oxide.

In step 4013, the substrate using a suitable technique such as etching with potassium hydroxide, until the silicon oxide layer 422 is exposed.

In step 4014, a glass substrate 432 is bonded to the exposed silicon oxide layer 422, using a suitable technique such as using a UV removable glue. The glass substrate 432 can provide mechanical support.

In step 4015, the sacrificial layer is removed by a suitable method such as wet etching. For example, polyimide can be removed by a suitable photoresist developer.

In step 4016, the features 40 are bonded to ROIC in the substrate 410 using a tin-silver alloy layer between the substrate 410 and the features 40 and annealing at about 220° C.

In step 4017, the glass substrate 432 is released from the silicon oxide layer 422 by illumination with UV light.

In step 4018, a heavily doped p type layer 435 is formed on the layer 421 of the features 400 by a suitable technique such as ion implantation through the silicon oxide layer 422. The heavily doped p type layer 435 can be annealed by laser to activate implanted dopant.

In step 4019, the silicon oxide layer 422 is removed by a suitable technique such as etching with HF.

In step 4020, an insulating material 433 is deposited by spin coating, evaporation or CVD to fill space between the features 400. The insulating material 433 preferably has a lower refractive index than the features 400. The insulating material 433 can be any suitable material such as silicon oxide and polyimide.

In step 4021, the insulating material 433 is planarized using a suitable technique such as chemical mechanical polishing (CMP) until the heavily doped p type layer 432 of the features 400 is exposed.

In step 4022, a transparent conductive oxide (TCO) layer 434 is deposited on the insulating material 433, using a suitable method such as thermal evaporation, e-beam evaporation, and sputtering. The TCO layer can comprise one or more suitable materials such as indium tin oxide, aluminum zinc oxide, zinc oxide, zinc indium oxide and graphene.

In step 4023, the insulating material 433 is optionally removed by a suitable method such as wet etching.

Figure 10:
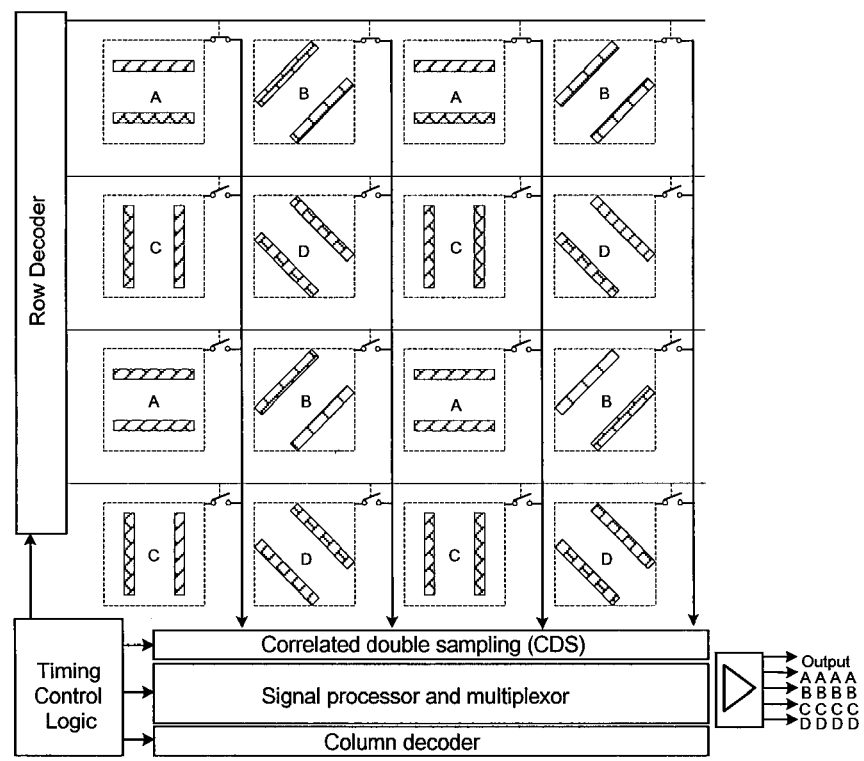
FIG. 10 shows a polarization detector array with the device of FIG. 1, 4, 6 or 8 integrated therein.

According to one embodiment as shown in FIG. 10, the device 10, 20, 30 or 40 can be integrated with electronic circuitry into a polarization detector array. The electronic circuitry can include address decoders in both directions of the detector array, a correlated double sampling circuit (CDS), a signal processor, a multiplexor. The electronic circuitry is functional to detect the electrical signal converted by the features 100, 200, 300 or 400 from at least a portion of light impinged thereon. The electric circuitry can be further functional to calculate an interpolation of electrical signals from several subpixels, the features on which extend in the same transverse direction. Other function of the electronic circuitry can include a gain adjustment, a calculation of Stoke's parameters. In particular, the subpixels can be arranged into a group (i.e. pixel). For example, in FIG. 10, a subpixel A and subpixels B, C and D can be arranged adjacent to each other and referred to as a pixel, wherein features on the subpixels B, C and D extend in transverse directions at 45°, 90° and −45° relative to a transverse direction in which features on the subpixel A extend.

Figure 11:
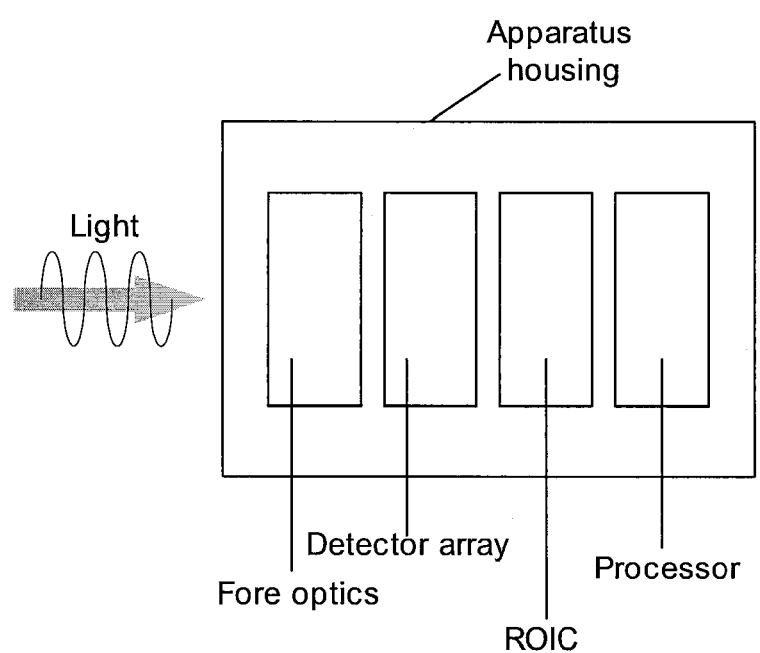
FIG. 11 shows a schematic of a light detector apparatus wherein the device of FIG. 1, 4, 6 or 8 is used as fore optics.

The device 10, 20, 30 or 40 can also be used as fore optics in a light detector apparatus as shown in the schematic in FIG. 11.

Figure 12:
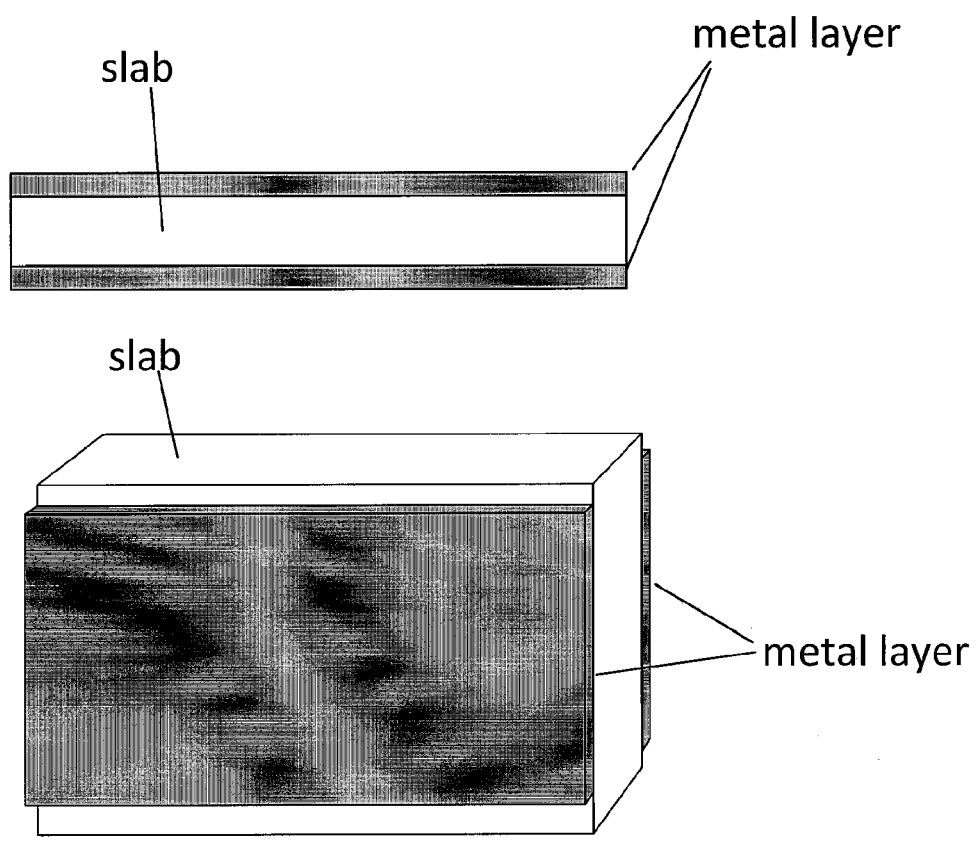
FIG. 12 shows a top view and a perspective view of a feature in the device of FIG. 1, wherein the feature has metal layers on its sidewalls.

According to an embodiment as shown in FIG. 12, the features 100, 200, 300 and 400 can each comprise a metal layer on each sidewall (i.e. surface extending in the transverse direction and the normal direction). The metal layer preferably has a thickness of about 5 nm to about 100 nm, more preferably about 50 nm. The metal layer substantially covers the entire sidewall and the metal layer does not extend to either end of the features in the normal direction.

The foregoing detailed description has set forth various embodiments of the devices and/or processes by the use of diagrams, flowcharts, and/or examples. Insofar as such diagrams, flowcharts, and/or examples contain one or more functions and/or operations, it will be understood by those within the art that each function and/or operation within such diagrams, flowcharts, or examples can be implemented, individually and/or collectively, by a wide range of hardware, software, firmware, or virtually any combination thereof.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation.

The subject matter described herein sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

All references, including but not limited to patents, patent applications, and non-patent literature are hereby incorporated by reference herein in their entirety.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following Claims.

What is claimed is:

1. A device operable to detect polarized light comprising: a substrate; a first subpixel; a second subpixel adjacent to the first subpixel; a first plurality of features in the first subpixel and a second plurality of features in the second subpixel, wherein the first plurality of features extend essentially perpendicularly from the substrate and extend essentially in parallel in a first direction parallel to the substrate and the second plurality of features extend essentially perpendicularly from the substrate and extend essentially in parallel in a second direction parallel to the substrate; wherein the first direction and the second direction are different; the first plurality of features and the second plurality of features react differently to the polarized light; wherein each of the first plurality of features comprises a p-i-n diode or forms a p-i-n diode with the substrate, and wherein the p-i-n diode is functional to convert at least a portion of the polarized light to an electrical signal.

2. The device of claim 1, wherein the polarized light has linear polarization, circular or elliptical polarization.

3. The device of claim 1, wherein the first plurality of features is equally spaced from each other.

4. The device of claim 1, wherein the first plurality of features comprises at least 2 features.

5. The device of claim 1, wherein the first plurality of features has a pitch of about 0.5 micron to about 5 microns, a height of about 0.3 micron to 10 microns, an aspect ratio of at least 4:1, or a combination thereof.

6. The device of claim 1, wherein space between features of the first plurality of features is filled with a transparent material.

7. The device of claim 1, wherein the substrate comprises electrical components configured to detect the electrical signal.

8. The device of claim 1, further comprising a first transparent electrode disposed on the first subpixel and electrically connected to each of the first plurality of features, and a second transparent electrode disposed on the second subpixel and electrically connected to each of the second plurality of features, wherein the first and second transparent electrodes are separate.

9. The device of claim 1, further comprising a reflective material deposited on areas of the substrate between features of the first plurality of features.

10. The device of claim 1, wherein each of the first plurality of features comprises an intrinsic semiconductor layer or a first lightly doped semiconductor layer, and a heavily doped semiconductor layer; the substrate comprises a second lightly doped semiconductor layer; wherein the second lightly doped semiconductor layer is an opposite type from the heavily doped semiconductor layer; intrinsic semiconductor layer or a first lightly doped semiconductor layer is disposed on the second lightly doped semiconductor layer; and the heavily doped semiconductor layer is disposed on the intrinsic semiconductor layer or the first lightly doped semiconductor layer; wherein the heavily doped semiconductor layer, the intrinsic layer or the first lightly doped semiconductor layer, and the heavily doped semiconductor layer form a p-i-n diode.

11. The device of claim 1, wherein each of the first plurality of features comprises a core of intrinsic semiconductor or lightly doped semiconductor, and a shell of heavily doped semiconductor; the substrate comprises a lightly doped semiconductor layer; wherein the lightly doped semiconductor layer is an opposite type from the shell; the core is disposed on the lightly doped semiconductor layer; the shell is conformally disposed over the core; wherein the shell, the core and the lightly doped semiconductor layer form a p-i-n diode.

12. The device of claim 1, wherein each of the first plurality of features comprises a core of lightly doped semiconductor, an intermediate shell of intrinsic semiconductor and an outer shell of doped semiconductor; wherein the intermediate shell is conformally disposed over the core; the outer shell is conformally disposed over the intermediate shell; the outer shell is of an opposite type from the core; wherein the outer shell, the intermediate shell and the core form the p-i-n diode.

13. The device of claim 1, wherein each of the first plurality of features comprises a first heavily doped semiconductor layer, a lightly doped semiconductor layer or intrinsic semiconductor layer, a second heavily doped layer; wherein the first heavily doped semiconductor layer is disposed on the lightly doped semiconductor layer or intrinsic semiconductor layer; the lightly doped semiconductor layer or intrinsic semiconductor layer is disposed on the second heavily doped layer; the first heavily doped layer is of an opposite type from the second heavily doped layer; wherein the first heavily doped layer, the lightly doped semiconductor layer or intrinsic semiconductor layer and the second heavily doped layer form the p-i-n diode.

14. A polarization detector array, comprising the device of claim 1 and electronic circuitry functional to detect an electrical signal.

15. The polarization detector array of claim 14, wherein the electronic circuitry is further functional to calculate an interpolation of subpixels of the device, adjust a gain and/or calculate Stoke's parameters.

16. The polarization detector array of claim 14, wherein the device comprises a first subpixel, a second subpixel, a third subpixel and a fourth subpixel, wherein features on the second, third and fourth subpixels extend in transverse directions at 45. degree., 90. degree. and −45. degree. relative to a transverse direction in which features on the first subpixel extend.

17. The device of claim 1, wherein the first plurality of features or the second plurality of features have a shape in a cross-section parallel to the substrate selected from the group consisting of a rectangle, an ellipse, convex-convex, concave-concave, plano- convex, and plano-concave.

18. The device of claim 1, further comprising a metal layer on each sidewall of each of the first plurality of features and the second plurality of features wherein the metal layer substantially covers the entire sidewall and the metal layer does not extend to either end of the features in a direction perpendicular to the substrate.

19. A method of fabricating a device of claim 1; the method comprising: forming at least one of the first plurality of features and the second plurality of features by conducting lithography, ion implantation, annealing, evaporation, atomic layer deposition, chemical vapor deposition, dry etch or a combination thereof.

20. The method of claim 19, further comprising making a p-i-n diode, in at least one of the first plurality of features and the second plurality of features.

21. The method of claim 19, wherein the first plurality of features and the second plurality of features are substantially shaped as blocks or prisms having a substantially rectangular shaped base, wherein the blocks or prisms protrude from a surface of the substantially rectangular shaped base.

22. A method of detecting polarized light, comprising obtaining the device of claim 1, exposing the device to polarized light, and detecting the polarization of polarized light.

23. The method of claim 22, wherein the features react to polarized light by converting at least a portion thereof to electrical signal.

24. A device operable to detect polarized light comprising: a substrate; a first subpixel; a second subpixel adjacent to the first subpixel; a first plurality of features in the first subpixel and a second plurality of features in the second subpixel;
wherein the first plurality of features and the second plurality of features react differently to the polarized light such that polarization of polarized light is determined; wherein each of the first plurality of features comprises a p-i-n diode or forms a p-i-n diode with the substrate, and wherein the p-i-n diode is functional to convert at least a portion of the polarized light to an electrical signal.

25. The device of claim 24, wherein the first plurality of features are arranged in a different orientation than the second plurality of features.

26. The device of claim 24, wherein the features react to polarized light by converting at least a portion thereof to electrical signal.

27. The device of claim 24, wherein each of the first plurality of features comprises a p-i-n diode or forms a p-i-n diode with the substrate, and wherein the p-i-n diode is functional to convert at least a portion of the polarized light to an electrical signal.

28. The device of claim 27, wherein the substrate comprises electrical components configured to detect the electrical signal.

29. The device of claim 24, wherein the first plurality of features and the second plurality of features are substantially shaped as blocks or prisms having a substantially rectangular shaped base, wherein the blocks or prisms protrude from a surface of the substantially rectangular shaped base.

30. A polarization detector array, comprising the device of claim 24 and electronic circuitry functional to detect an electrical signal.

31. The polarization detector array of claim 30, wherein the electronic circuitry is further functional to calculate an interpolation of subpixels of the device, adjust a gain and/or calculate Stoke's parameters.

32. A method of fabricating a device of claim 24; the method comprising: conducting lithography, ion implantation, annealing, evaporation, atomic layer deposition, chemical vapor deposition, dry etch or a combination thereof.

33. The method of claim 32, wherein the method includes making a p-i-n diode.

34. The method of claim 32, wherein the first plurality of features and the second plurality of features are substantially shaped as blocks or prisms having a substantially rectangular shaped base, wherein the blocks or prisms protrude from a surface of the substantially rectangular shaped base.

35. A method of detecting polarized light, comprising obtaining the device of claim 24, exposing the device to polarized light, and detecting the polarization of polarized light.

36. The method of claim 35, wherein the features react to polarized light by converting at least a portion thereof to electrical signal.

* * * * *